United States Patent
Chang et al.

(10) Patent No.: US 12,197,269 B2
(45) Date of Patent: Jan. 14, 2025

(54) SYSTEM AND METHOD FOR MULTI-FUNCTION TOUCHPAD FOR HUMAN PROXIMITY SENSING

(71) Applicant: Dell Products, LP, Round Rock, TX (US)

(72) Inventors: Ching Wei Chang, Cedar Park, TX (US); Barry Paul Easter, Austin, TX (US); Andelon Tra, Austin, TX (US)

(73) Assignee: DELL PRODUCTS LP, Round Rock, TX (US)

( * ) Notice: Subject to any disclaimer, the term of this patent is extended or adjusted under 35 U.S.C. 154(b) by 365 days.

(21) Appl. No.: 17/585,910

(22) Filed: Jan. 27, 2022

(65) Prior Publication Data
US 2023/0244294 A1    Aug. 3, 2023

(51) Int. Cl.
| | |
|---|---|
| *G06F 1/3287* | (2019.01) |
| *G06F 1/16* | (2006.01) |
| *G06F 1/3231* | (2019.01) |
| *G06F 1/3246* | (2019.01) |
| *G06F 3/044* | (2006.01) |
| *H01Q 1/22* | (2006.01) |
| *H03K 17/955* | (2006.01) |
| *H04W 52/18* | (2009.01) |

(52) U.S. Cl.
CPC ............ *G06F 1/3287* (2013.01); *G06F 1/162* (2013.01); *G06F 1/3231* (2013.01); *G06F 1/3246* (2013.01); *G06F 3/044* (2013.01); *H01Q 1/2266* (2013.01); *H03K 17/955* (2013.01); *G06F 2203/04107* (2013.01); *G06F 2203/04108* (2013.01)

(58) Field of Classification Search
CPC ..... H04W 52/04; H04W 52/06; H04W 52/18; H04W 52/226; G06F 1/1616; G06F 1/1618; G06F 1/162; G06F 1/3231; G06F 1/3234; G06F 1/3246; G06F 1/3287; G06F 1/3296; G06F 3/044; H01Q 1/2258; H01Q 1/2266; H03K 17/945; H03K 17/95; H03K 17/955
See application file for complete search history.

(56) References Cited

U.S. PATENT DOCUMENTS

| | | |
|---|---|---|
| 5,920,309 A | 7/1999 | Bisset |
| 8,326,385 B2 | 12/2012 | Brogle |

(Continued)

*Primary Examiner* — Quochien B Vuong
(74) *Attorney, Agent, or Firm* — Prol Intellectual Property Law, PLLC; H. Kenneth Prol

(57) ABSTRACT

An information handling system may include a processor, a memory, a radio to transceive wirelessly via an antenna with a wireless network, and a touchpad to receive touch input via a surface of the touchpad when the information handling system is detected in a clamshell configuration, where the touch input is received by a touchpad driver and processed to a corresponding touch input command. An orientation sensor to detect when the information handling system is changed to a tablet configuration and a controller to deactivate the touchpad to receive the touch input for processing to a corresponding touch input command and to activate and operatively couple a metallic layer of the touchpad to a proximity sensor integrated circuit to detect when a user's body is close to the antenna to reduce the power for transmission via the antenna to reduce a specific absorption rate (SAR) level.

20 Claims, 13 Drawing Sheets

(56) References Cited

U.S. PATENT DOCUMENTS

| | | | | |
|---|---|---|---|---|
| 8,411,045 B2* | 4/2013 | Futter | ............... | G06F 3/0443 |
| | | | | 345/173 |
| 9,218,025 B2* | 12/2015 | Bates | ............... | G06F 1/1662 |
| 9,531,420 B1* | 12/2016 | Prendergast | .......... | H04W 52/34 |
| 9,916,031 B2* | 3/2018 | Putzolu | ............. | G06F 1/1616 |
| 9,935,378 B2 | 4/2018 | Camacho | | |
| 10,244,488 B2* | 3/2019 | Lee | ................ | H04W 52/367 |
| 11,009,936 B2 | 5/2021 | Hamlin | | |
| 11,112,917 B2 | 9/2021 | Rouaissia | | |
| 2005/0156906 A1* | 7/2005 | Chiu | ................ | G06F 3/0445 |
| | | | | 345/173 |
| 2009/0322351 A1 | 12/2009 | Mcleod | | |
| 2012/0113049 A1 | 5/2012 | Paulsen | | |
| 2013/0005413 A1 | 1/2013 | Brogle | | |
| 2019/0041929 A1 | 2/2019 | Bologna | | |
| 2019/0237848 A1 | 8/2019 | Ramasamy | | |
| 2021/0293868 A1 | 9/2021 | Strutt | | |
| 2021/0367637 A1 | 11/2021 | Wong | | |
| 2021/0408685 A1 | 12/2021 | Chang | | |

* cited by examiner

SYSTEM AND METHOD FOR MULTI-FUNCTION TOUCHPAD FOR HUMAN PROXIMITY SENSING

FIELD OF THE DISCLOSURE

The present disclosure generally relates to a human (e.g., user) proximity detector of an information handling system. The present disclosure more specifically relates to the utilizing of a click pad or touchpad of an information handling system for use during human proximity detection.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. The radio frequency (RF) radio and antenna are used to operatively couple the information handling system to a wireless network. Further, the information handling system may include proximity sensing to detect human proximity to the antenna for specific absorption rate (SAR) protections.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
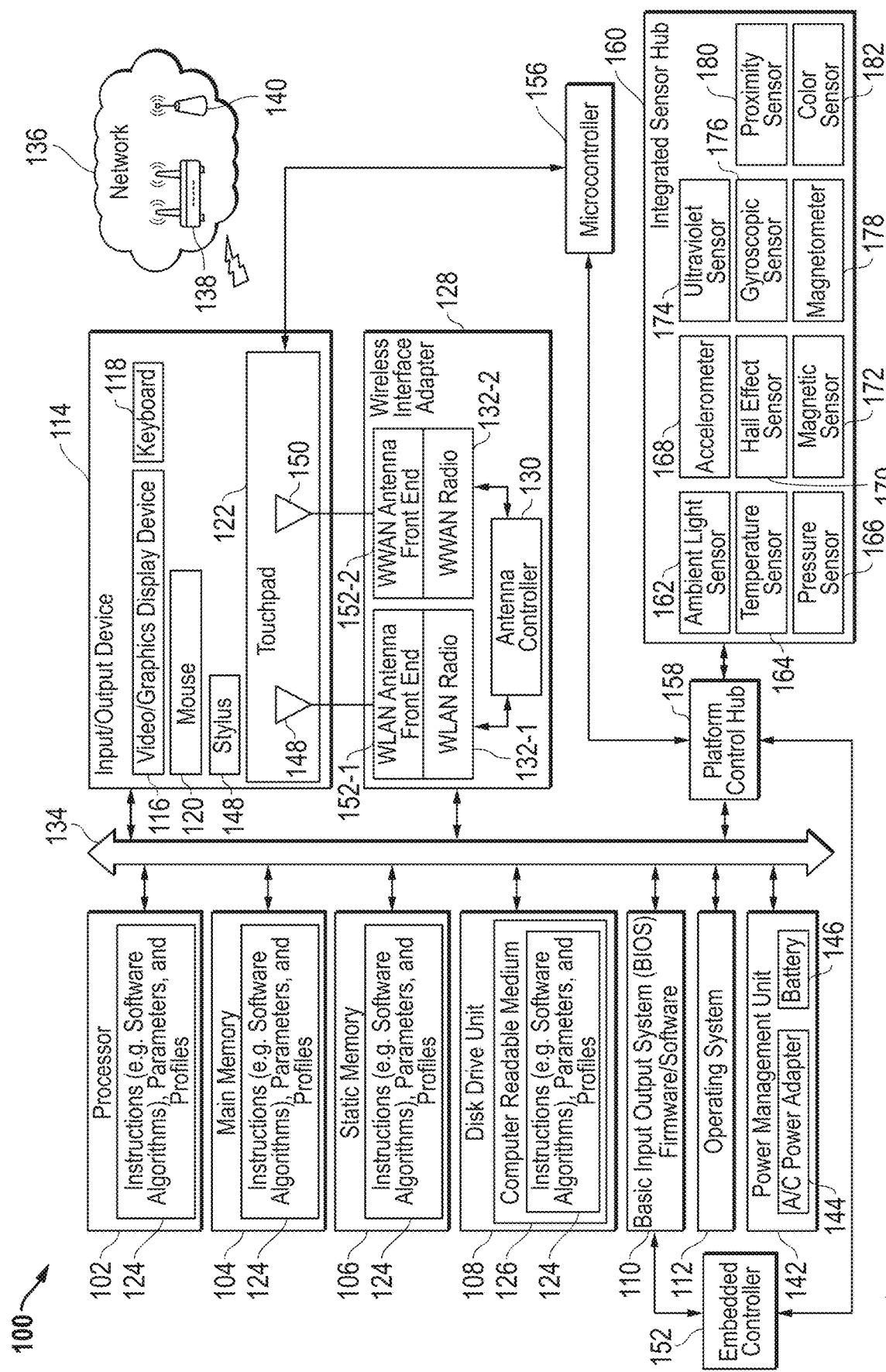
FIG. 1 is a block diagram illustrating an information handling system with a human proximity sensing system according to an embodiment of the present disclosure.

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Embodiments of the present disclosure provide for a system and method to reduce a specific absorption rate (SAR) of electromagnetic (EM) radiation at or near one or more antennas operating at the information handling system. With the progression and complexity of multiple wireless communication systems (e.g., antennas) integrated into an information handling system the complexity of how these communication systems interact with each other increases especially when there are multiple transceiving antennas in close proximity to one another such as those antennas operating at frequencies associated with a wide area network (WAN), a local area network (LAN), a wireless local area network (WLAN), a wireless personal area network (WPAN), and/or a wireless wide area network (WWAN) as described herein. Indeed, in order to achieve the best wireless performance so as to maximize full functionality out of these different wireless technologies, an information handling system may be designed to be compliant to regulatory requirements when multiple transmitting antennas are in the information handling system. One such regulation is a regulation on the amount of EM radiation emitted by these wireless communication devices. The SAR rate may be measured and kept at or below a threshold level so as to protect the user's body from potential adverse effects of the exposure to this EM radiation.

However, as the configuration of the information handling system is changed into, for example, a tablet configuration, the ability of the antennas to transceive through the metallic chassis of the information handling system is altered. This is because the metallic chassis of the display chassis and/or base chassis of the information handling system may interfere or prevent transception of this data. This is further exasperated when the display chassis, also comprising metallic chassis, is adjacent to the base chassis when in the tablet configuration. Although certain windows may be formed in the base or display chassis or the click pad/touchpad to allow for the antenna to transmit, the ability of the sensors used to detect a SAR may be significantly reduced in certain configurations unless additional proximity sensors are displayed. This may add costs or alter the aesthetics of the information handling system chassis. The touchpad in embodiments of the present specification may be used as a proximity sensor to increase the ability to detect the SAR by operatively coupling the metallic layers (e.g., layers with conductors) to an integrated sensor hub (ISH) or directly to a proximity sensor integrated circuit (IC) used to detect the proximity of a user to the antenna at or under the touchpad. In some embodiments, this process may include operatively uncoupling the touchpad from a controller and driver associated with the touchpad operations or simply disabling the driver or controller from accepting or processing touch inputs when the information handling system is in a configuration where the touchpad is not accessible (e.g., the tablet configuration) so as to prevent touchpad input from being received at the operating system or other software application from the touchpad inadvertently. However, this does not impact the operations of the information handling system because the touchpad is now face down on a surface or a user's lap and inaccessible to the user when the information handling system is in the tablet configuration. In tablet mode, the proximity sensor may use these conductor layers to enhance the range possible to detect the presence of a user through a c-cover of a base chassis better than proximity sensors in the display chassis or at other portions such as a side wall of the base chassis. In some embodiments, this range of the touchpad as a proximity sensor may be as wide as 6 cm.

The present specification describes an information handling system that includes a processor a memory, a power management unit (PMU), and an antenna controller to provide instructions to a radio to cause an antenna to transceive wirelessly with a network. The information handling system also includes a touchpad to receive input via a surface of the touchpad when the information handling system is a clamshell configuration with a video/graphics display device of a display chassis of the information handling system upright and a bottom side of a base chassis information handling system on a surface. A sensor or plurality of sensors are included to detect when the information handling system is in a tablet configuration with a back side of the display chassis of the information handling system facing the bottom side of the base chassis of the information handling system. A controller is present to, when the sensor detects the information handling system is in a tablet configuration, deactivate the touchpad to receive input and operatively couple a metallic layer of the touchpad to a proximity sensor to detect when a user's body is close to the antenna and reduce the power consumption at the antenna located in the base chassis such as at or near a touchpad to reduce a SAR level when the proximity sensor detects, via the metallic layer, when the user's body is close to the antenna. As described herein, the proximity sensing conducted through the touchpad may determine whether the power to the antenna is reduced or increased if and when human proximity is detected.

Turning now to the figures, FIG. 1 illustrates an information handling system 100 similar to the information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver 140, a wireless telephone, a control system, a camera, a scanner, a printer, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) via a processor, controller, or other processing system that specify actions to be taken by that machine. Further, while a single information handling system 100 is illustrated, the term "system" shall also be taken to include any collection of systems or sub-systems with any number of processors, controllers, or processing systems that individually or jointly execute a set, or multiple sets, of instructions to perform one or more computer functions.

The information handling system 100 may include memory 104, 106, 108 (volatile (e.g., random-access memory, etc.), nonvolatile (read-only memory, flash memory etc.) or any combination thereof), one or more processing resources, such as a central processing unit (CPU), a graphics processing unit (GPU), controllers, hardware control logic, or any combination thereof. Additional components of the information handling system 100 may include one or more storage devices, one or more communications ports for communicating with external devices, as well as various input and output (I/O) devices 114, such as a keyboard 118, a touchpad 122, a mouse 120, a headset, a stylus 148, a video/graphics display device 116, or any combination thereof. Portions of an information handling system 100 may themselves be considered information handling systems 100.

Information handling system 100 may include devices or modules that embody one or more of the devices or execute instructions for one or more systems and modules. The information handling system 100 may execute instructions (e.g., software algorithms), parameters, and profiles 124 that may operate on servers or systems, remote data centers, or on-box in individual client information handling systems according to various embodiments herein. In some embodiments, it is understood any or all portions of instructions (e.g., software algorithms), parameters, and profiles 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 126 storing instructions (e.g., software algorithms), parameters, and profiles 124 executable by the antenna controller 130, embedded controller 154, a microcontroller unit 156, or any other processing device (e.g., processor 102), and disk drive unit 108 (volatile (e.g., random-access memory, etc.), nonvolatile memory (read-only memory, flash memory etc.) or any combination thereof. The information handling system 100 may also include one or more buses 134 operable to transmit communications between the various hardware components such as any combination of various I/O devices 114 as well as between processors 102, and the embedded controller 152. In an embodiment, an operating system (OS) 112, a basic input/output system (BIOS) 110, and device drivers' computer executable code instructions may be executed by the processor 102 or other controllers to initiate the hardware, manage resources of the information handling system, schedule computing tasks among other processes associated with the execution of the BIOS 110 and OS 112 by the processor 102 or controllers. The buses 134 may also provide a communication link between hardware devices associated with the wireless interface adapter 128, a radio module, a peripheral device driver, a wireless radio 132-1, 132-2, and the power management unit (PMU) 142 among other hardware described herein and as described herein.

The information handling system 100 may further include a video/graphics display device 116. The video/graphics display device 116 in an embodiment may function as a liquid crystal display (LCD), an organic light emitting diode (OLED), a flat panel display, or a solid-state display. Additionally, the information handling system 100 may include an I/O device 114 that allows the user to interface with the information handling system 100 via the video/graphics display device 116, such as a cursor control device (e.g., the mouse 120, touchpad 122, or gesture or touch screen input), and the keyboard 118 or stylus 148, among others. Various drivers and control electronics may be operatively coupled to operate the I/O device 114 according to the embodiments described herein. The touchpad 122 or click pad is an input/output (I/O) device 114 that may operate as a proximity sensor for SAR power control according to some embodiments.

The network interface device in FIG. 1 is shown as wireless interface adapter 128 but may also be a wired network interface device as is understood in the art and may provide connectivity to a network 136, e.g., a wide area network (WAN), a local area network (LAN), wireless local area network (WLAN), a wireless personal area network (WPAN), a wireless wide area network (WWAN), or other network accessible via a base station 140 or access point 138. The network interface device shown as wireless interface adapter 128 may provide connectivity to a network 136 via operation of a radio module including radios 132-1, 132-2, antenna front ends 152-1, 152-2, antennas 148, 150, antenna controller(s) 130 and other components for wireless RF communication. In an embodiment, the radio module may include the antenna controller 130 or may form a different physical device in some embodiments. In an embodiment, the bus 134 may be implemented to communicate with the radio module wireless radios 132-1, 132-2. It is appreciated that any number of wireless radios 132-1, 132-2 and RF front ends 152-1, 152-2 may be associated with the radio module and may also be associated with a plurality of antennas 148, 150 within the information handling system and may operate under any wireless protocol described herein. In an example embodiment, the radio module may be a 5G mm Wave radio module or a WiFi radio module and may be referred to as a 5G module, 5G radio module, WWAN module, WiFi radio module, WiFi module, WLAN module, or the like herein. Connectivity to a network 136 may be via wired or wireless connection. The wireless interface adapter 128 may operate in accordance with any wireless data communication standards in various embodiments. To communicate with a wireless local area network, standards including IEEE 802.11 a/h/j/n/ac/ax WLAN standards, IEEE 802.15 WPAN standards, WWAN such as 3GPP or 3GPP2, or similar wireless standards may be used. In some aspects of the present disclosure, one wireless interface adapter 128 may operate two or more wireless links. Information handling systems 100 including those that are mobile in embodiments of the present disclosure may employ a plurality of antenna systems for communication via wireless links operating on a variety of radio access technologies (RAT). For example, a mobile information handling system in an embodiment of the present disclosure may employ separate antenna systems for Wi-Fi signals, wireless wide area network (WWAN) signals, Bluetooth signals, and wireless local area network (WLAN) signals. WWAN signals in embodiments of the present disclosure may include 2G standards such as GSM, 2.5G standards such as GSM EDGE and GPRS, 3G standards such as W-CDMA/UMTS and CDMA 2000, 4G standards such as LTE, LTE-A, LTE-LAA, 5G standards, small cell WWAN, and the like. Wi-Fi and WLAN signals in embodiments of the present disclosure may include wireless links adhering to standards such as, for example, IEEE 802.11 WiFi, IEEE 802.11ad WiGig, IEEE 802.15 WPAN, and IEEE 802.11ax-2021 (e.g., WiFi 6 and 6E, 6 GHz technologies). In other aspects, several antenna systems may be available for each RAT to enable aggregated data communications such as via plural multiple in, multiple out (MIMO) streams (e.g., Wi-Fi MIMO or cellular MIMO) to enhance data bandwidth or reliability. In some examples, an information handling system 100 may support multi-RAT radios (4G, 5G, WLAN) that require simultaneous transmission using multiple antennas to support various modes of transmission (e.g., uplink (UL) MIMO and 5G E-UTRAN new radio (EN-DC)). With 5G technology, these information handling systems may use, in an example embodiment, sub-6 GHZ antennas and mmWave antennas, resulting in several antennas operating in the information handling system.

Wireless interface adapter 120 may connect to any combination of macro-cellular wireless connections including 2G, 2.5G, 3G, 4G, 5G, emerging 6G or the like from one or more service providers or privately administered network providers. The wireless interface adapter 128 may also connect to any WLAN networks such as Wi-Fi networks. Utilization of radiofrequency communication bands according to several example embodiments of the present disclosure may include bands used with the WLAN standards and WWAN carriers, which may operate in both licensed and unlicensed spectrums.

In some embodiments, software or firmware may be executed by processing resources, or may operate on dedicated hardware implementations such as application specific integrated circuits, programmable logic arrays and other hardware devices which may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or hardware or processing resources that receive and execute instructions, parameters, and profiles 124 responsive to a propagated signal, so that a device connected to a network 136 may communicate voice, video or data over the network 136. Further, the instructions 124 may be transmitted or received over the network 136 via the network interface device or wireless interface adapter 128.

The information handling system 100 may include a set of instructions 124 that may be executed to cause the computer system to perform any one or more of the methods or computer-based functions disclosed herein. For example, instructions 124 may be executed by an antenna controller 130 and wireless radio 132-1, 132-2 modules, a processor 102, and embedded controller 152, and/or microcontroller 156 and may include software agents, or other aspects or components used to execute the methods and systems described herein. Various software modules comprising application instructions 124 may be coordinated by an operating system (OS) 112, and/or via an application programming interface (API). An example OS 112 may include Windows®, Android®, and other OS types. Example APIs may include Win 32, Core Java API, or Android APIs. Additionally, execution of the instructions described herein may be via execution of firmware by the antenna controller 130.

The disk drive unit 108 may include a computer-readable medium 126 in which one or more sets of instructions 124 such as software may be embedded and executed by the antenna controller 130, processor 102, microcontroller 156, and/or embedded controller 152, in an embodiment. Similarly, main memory 104 and static memory 106 may also contain a computer-readable medium for storage of one or more sets of instructions, parameters, or profiles 124. The disk drive unit 108 and static memory 106 may also contain space for data storage. Further, the instructions 124 may embody one or more of the methods or logic as described herein. For example, instructions relating to and executed by the antenna controller 130, embedded controller 152, microcontroller 156, processor 102, software algorithms, processes, and/or methods may be stored here. In a particular embodiment, the instructions, parameters, and profiles 124 may reside completely, or at least partially, within the main memory 104, the static memory 106, and/or within the disk drive 108 during execution by the processor 102 of information handling system 100. As explained, some or all of the instructions 124 to be executed by a processor 102 for software applications may be executed locally, remotely or a combination thereof. The main memory 104 and the processor 102 also may include computer-readable media.

Main memory 104 may contain computer-readable medium (not shown), such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may include computer-readable medium (not shown), such as NOR or NAND flash memory in some example embodiments. The computer executable instructions 124 to be executed by the antenna controller 130, processor 102, a microcontroller 156, or embedded controller 152 may be stored in static memory 106, or the disk drive unit 108 on a computer-readable medium 126 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

As described herein, the information handling system 100 may further include a power management unit (PMU) 142 (a.k.a. a power supply unit (PSU)). The PMU 142 may manage the power provided to the components of the information handling system 100 such as the processor 102, one or more disk drive units 108, a graphical processing unit (GPU), a video/graphic display device 116 or other I/O device 114 such as the stylus (e.g., via a wireless charging system), touchpad 122, keyboard 118, mouse 120, and other components that may require power when a power button has been actuated by a user. In an embodiment, the PMU 142 may monitor power levels and be electrically coupled to the information handling system 100 to provide this power and coupled to bus 134 to provide or receive data or instructions. The PMU 142 may regulate power from a power source such as a battery 146 or A/C power adapter 144. In an embodiment, the battery 146 may be charged via the A/C power adapter 144 and provide power to the components of the information handling system 100 via wired connections as applicable, or when A/C power from the A/C power adapter 144 is removed.

In the context of the present specification, the information handling system 100 is a 360-degree laptop type information handling system. In these embodiments, the chassis of the information handling system 100 may include a display housing that includes an "a-cover" which serves as a back cover for the display housing and a "b-cover" which may serve as the bezel, if any, for a display screen of the information handling system such as a laptop information handling system. In this embodiment, this laptop information handling system may have a chassis that forms a base housing and includes a "c-cover" housing a keyboard, touchpad, speaker grill, and any cover in which these components are set and a "d-cover" housing a processing device, memory the PMU 142, wireless interface adapter 128 and other components of the information handling system 100 in the base housing for the laptop information handling system. Because, in an embodiment, the information handling system 100 is a 360-degree laptop type information handling system 100, the configuration of the information handling system 100 may be changed during use. For example, the information handling system 100 may be placed in a clamshell configuration where the base chassis is placed on a surface with the display chassis placed upright. In another example, the information handling system 100 may be placed in a tablet configuration. This tablet configuration may include the back side of the display chassis (e.g., the a-cover) of the information handling system facing the bottom side of the base chassis (e.g., the d-cover) of the information handling system 100. In this tablet configuration, the keyboard 118 and touchpad 122 may be made inaccessible to the user because a top side of the base chassis is placed on a surface.

In an embodiment, the information handling system 100 may include a number of sensors used to detect which configuration the information handling system 100 is in. In an embodiment, these sensors may be operatively coupled to an integrated sensor hub (ISH) 160. The ISH 160 is a set of integrated circuits including a low power co-processor to manage sensor polling, receiving sensor communications, and algorithm processing to reduce required processing at a CPU or other processor and may be operatively coupled to a processing device such as a processor 102, an embedded controller 152, or a microcontroller 156 as well as a platform control hub 158. The processors described herein may be augmented by this platform control hub 158. Additionally, the platform control hub 158 may interface to functional components of the information handling system 100 such as the ISH 160. The ISH 160 may be any type of device or computer-executable program code that gathers any data or information from any number and type of sensors (e.g., 162 through 184) associated with the information handling system 100. As described herein, the ISH 160 may then pass the data or information onto the platform control hub 158 to determine the configuration orientation as well as other physical states of the information handling system 100. For example, the ISH 160 may link to one or more orientation or state sensors that include a temperature sensor 164, a pressure sensor 166, a Hall effect sensor 170, a magnetic sensor 172, a magnetometer 178, an accelerometer 168, a hinge sensor, a light sensor (e.g., ultraviolet light sensor 174, infrared (IR) light sensor, ambient light sensor 162, color sensor 182), a gyroscopic sensor 176, a camera, and a proximity sensor 180, among others. Each of these sensors may provide data to an ISH 160 which provides that data to the platform control hub 158. Each of these sensors may provide data to the ISH 160 in order to determine if and when the information handling system 100 is in a specific configuration such as the tablet configuration or clamshell configuration as described herein. For example, various orientation or state sensors may include a Hall effect sensor 170 or light sensor or camera that can detect whether a 360-degree laptop-type information handling system is open, closed or in a tablet configuration based on detected light or magnetic fields in these configurations. A hinge sensor, accelerometer 168, direction sensors (e.g., magnetic north or location sensors) or gyroscope sensor 176 may be other orientation sensors that can detect the configuration or orientation of a display chassis relative to a base chassis to determine a configuration of the 360-degree information handling system such as clamshell or tablet configurations.

As described herein, the touchpad 122 may have a plurality of functions depending on the configuration that the information handling system 100 is placed in. As described herein, the information handling system 100 includes a touchpad 122 used to receive input from a user during operation when the information handling system 100 is in a clamshell configuration, for example. In the embodiments described herein, the information handling system 100 may, via a software driver, receive input from a user via the touchpad 122. In an example embodiment, the touchpad 122 may include one or more metallic layers that detect the touch of a user on the surface of the touchpad 122 and converts the movement and touch by the user into input such as to control a pointer displayed on the video display device 116 or select icons on the video display device. In order to do this the touchpad 122 may include a metallic layer that operate with two conductor layers each having an array of conductors arranged in parallel lines. These layers may be separated by an insulation layer with the parallel lines of the conductors on each layer at right angles (e.g., perpendicular) to each other to form a grid. In an embodiment, the metallic layer and the conductors may be made of copper. An electrical signal may be applied to the array of conductors and the current between the nodes creates a proportional capacitance. As the user touches the surface of the touchpad 122, this results in a change in capacitance at the location along the surface of the touchpad 122. This change in capacitance is detected and used as input as described herein. This detection of touch from a user may be determined by a processor 102, an embedded controller 152, a microcontroller 156 or the like executing a touchpad driver. As described in the execution of the touchpad driver by any of the processing devices or processing resourced described is conducted when the information handling system 100 is in a specific configuration such as a clamshell configuration. As described herein, the orientation of a display chassis relative to a base chassis of the information handling system 100 may describe the configuration of the information handling system 100.

As the configuration of the information handling system 100 is changed between various configurations, the use of the touchpad 122 may also be changed. For example, as the configuration of the information handling system 100 changes to a tablet configuration, the touchpad 122 may be used as a proximity sensor in embodiments herein to detect a lap or a person holding the information handling system placed in the tablet configuration. As described herein, the metallic and conductor layers within the touchpad 122 enhance the range possible to detect the presence of a user due to the increased size of the touchpad 122. This, therefore, increases the proximity sensing of the information handling system 100 during operation. In some embodiments, this range may be as wide as 6 cm. In an example embodiment where the base chassis and display chassis of the information handling system include metallic chassis, the sensing distance may be between 0 mm to 2 mm where dedicated proximity sensors are used. For those same dedicated proximity sensors that are placed behind a RF transparent window, for example, a sensing distance can be realized of between 8 mm to 15 mm. In the embodiments presented herein, the touchpad repurposed as a proximity sensor may have a sensing distance of 20 m or above. In some embodiments, the proximity detection functions of the touchpad 122 described herein may be initiated while the information handling system 100 is in the tablet configuration or in the clamshell orientation. For example, when the information handling system 100 is in the clamshell orientation, the touchpad 122 may be tuned to detect a user's hand or finger as it approaches the touchpad 122 for proximity as well as tuned differently to detect the touch of a user's finger on the touchpad 122 for receiving a touchpad input command for a software application or cursor control as described herein. In an embodiment, the touchpad may be tuned to detect both near presence (e.g., 20 mm or above away from the touchpad) and a touch at the touchpad. For example, as the human presence is detected via detected changes in the capacitance in the metallic layers of the touchpad, the level of change in the capacitance may be different as a user's body part approaches the touchpad as compared to as when a user's body (e.g., a finger) contacts the surface of the touchpad. These different levels of change in capacitance may be threshold levels that when reached indicate human proximity (e.g., a first capacitive threshold) or human touch at the touchpad (e.g., a second capacitive threshold). As described herein, a look-up table may include data descriptive of the first capacitive threshold and the second capacitive threshold and may be used by, for example, the embedded controller 152 to determine whether a proximity event is detected (e.g., human proximity is detected) near the touchpad.

In order to detect when the information handling system 100 is in the tablet configuration, the sensors (e.g., 162 through 184) may be used. In an example embodiment, a hall effect sensor 170 may be used to detect a magnetic field from one or more magnets placed within the chassis of the information handling system. For example, a magnet may be placed in a display chassis on an interior surface of the a-cover. In this embodiment, the hall effect sensor 170 may be placed in the base chassis on an interior surface of the d-cover. When the back side of the base chassis (e.g., the d-cover) comes close to and/or abuts the display chassis (e.g., a-cover) thereby indicating that the information handling system 100 has been placed in a tablet configuration, the hall effect sensor may detect the magnetic field at the magnet in the display chassis. When the hall effect sensor detects this magnetic field, it may send a signal to the processor 102, microcontroller 156, and/or embedded controller 152 in order to indicate that the information handling system 100 has been placed in the tablet configuration. It is appreciated that the arrangement of the hall effect sensor 170 relative to the magnet may be reversed with the hall effect sensor 170 being placed in the display chassis with the magnet placed within the base chassis. Similarly, the magnetic field of the magnet in the bases chassis may be detected by the hall effect sensor 170 in the display chassis.

Other example embodiments may include the use of the other sensors (e.g., 162 through 184) in the information handling system 100 in order to determine the configuration of the information handling system 100 that includes, at least, a tablet configuration or a clamshell configuration. In an example embodiment, an accelerometer 168, a magnetometer 178, a magnetic sensor 172, or the like may be used to detect the configuration of any portion of the chassis of the information handling system 100 (e.g., display chassis and base chassis) based on a detected reference direction such as "up" or "north" in order to determine the orientation of the display chassis relative to the base chassis of the information handling system 100 and thereby determine the configuration of the information handling system 100 (e.g., clamshell configuration, tablet configuration, open configuration, closed configuration). This information gathered at the ISH 160 may be used individually or in combination to determine if and when the information handling system 100 is in a clamshell configuration or a tablet configuration.

In an embodiment, a camera (e.g., a webcam) may be used to capture an image to determine if a portion of the base chassis is in the image. Where the captured image indicates that a portion of the base chassis is present in the image via, for example, image detection algorithms, the ISH may be provided with this data and indicate to the embedded controller 152 that the information handling system 100 is in a clamshell orientation.

In an embodiment, an IR sensor may be used to detect IR light emitted by an IR light source. Similar to the hall effect sensor 170 and the magnet, the IR light source may be housed in one of the display chassis or the base chassis while the IR light sensor is housed in the other of the display chassis or the base chassis. The detection of the IR light by the IR light sensor, in an embodiment, may determine the relative orientation of the base chassis to the display chassis via the detection of this IR light and the relative intensity of the IR light by the IR light sensor.

Based on the detected configuration, the touchpad 122 may act as an input device or be operatively coupled to the ISH 160 and act as a proximity sensor 180. In an embodiment, when the ISH 160 and sensors (e.g., 162 through 184) detect that the information handling system 100 is in a clamshell configuration or any other configuration that is not a tablet configuration, the touchpad 122 may operate as an input device. That is, in this example scenario, the processor 102, a microcontroller 156, or embedded controller 152 may execute a device driver in order to detect human touch at the touchpad 122 and provide input to be represented on the video/graphics display device 116. As such, the plurality of conductors on the plurality of conductor layers within the touchpad 122 are used to detect changes in the capacitance levels at those conductors when a specific voltage is passed through the conductor arrays.

As the sensors (e.g., 162 through 184) detect that the information handling system 100 is in a tablet configuration, the purpose and use of the touchpad 122 changes. In this embodiment, the metallic layers (e.g., the metallic layer and/or conductor layers) of the touchpad 122 may be repurposed as a proximity sensor. This repurposing of the metallic layers of the touchpad 122 as a proximity sensor may add more proximity sensors to the information handling system 100 in order to detect the presence of a human near the antennas. As described herein, the conversion of the information handling system 100 into the tablet configuration may cause the sensing capabilities of other proximity sensors 180 within the chassis of the information handling system 100 to not perform as well or otherwise be inhibited from detecting human presence. Because the touchpad 122 is no longer used as in input device due to its relative location to the video/graphic display device 116 in tablet configuration, the metallic layers may be operatively coupled to the ISH 160 as an additional or the proximity sensor similar to proximity sensors 180 and used to detect the presence of a human being. In an embodiment, due to the relatively larger surface areas of the metallic layers within the touchpad 122, the detectable range of this proximity sensor 180 may be significantly increased and, in some cases, may be as long or far as 20 mm or more.

During operation and as the processors 102 or controller such as the embedded controller (EC) 152 detect that the information handling system 100 has been placed in a tablet configuration, the embedded controller 152 may direct a microcontroller 156 or other processing device to switch the touchpad 122 off from being operatively coupled to the processor 102 for receiving touchpad inputs. According to one or more embodiments herein, the EC 152 or the MCU 156 may operatively couple the metallic layers of the touchpad 122 to the ISH 160 for use as a proximity sensor. The platform control hub 158 may operatively couple the metallic layers of the touchpad 122 to the processor 102 EC, 152, or MCU 156, or other processing device executing software used to detect the presence of a human via the touchpad 122 as one of the proximity sensors 180 within the information handling system. Because the embedded controller 152 operates below the operating system 112, use of the EC 152 and PCH 158 allows the repurposing of the touchpad 122 regardless of any hardware, software, or firmware being executed on the information handling system 100 at the OS 112 level.

As the information handling system 100 has been placed in a tablet configuration and as the touchpad 122 has been repurposed to function as a proximity sensor 180, the metallic layers of the touchpad 122 may proceed to monitor for human presence via a capacitive detection of a human body part near the touchpad 122. If and when human presence is detected via detected changes in the capacitance in the metallic layers of the touchpad 122, the power provided to any given antenna or a nearby antenna may be reduced. By reducing power to the antenna(s), the SAR of EM radiation at or near the antenna(s) is reduced preventing potential injury to the user during use of the information handling system 100. The processor 102 may continue to monitor, via the ISH 160, for human proximity as the information handling system 100 is in the tablet configuration, reducing power to the antenna(s) when human proximity is detected and increasing power to the antennas when human proximity is not detected. If and when the configuration of the information handling system 100 is moved from the tablet configuration to another configuration (e.g., clamshell configuration) as detected vit the Hall effect sensor or other orientation sensors of the ISH 160, the embedded controller 152 may once again operatively couple the touchpad 122 to a processor executing the touchpad driver in order to detect input from a user at the touchpad 122. In an embodiment, the repurposing of the metallic layers of the touchpad 122 is not completed until the information handling system 100 is in the tablet configuration. When the sensors (e.g., 162 through 184) detect that the configuration of the information handling system 100 has been changed from tablet configuration, the repurposing may end in some embodiments.

By repurposing the metallic layers of the touchpad 122 in this manner a relatively larger surface area may be used to detect the presence of a user operating the information handling system 100 while in the tablet configuration. This results in an increase in range to detect human presence even when the metallic chassis of the information handling system 100 prevents other proximity sensors 180 within the information handling system 100 from accurately detecting the presence of the user. By reducing power provided to the antenna(s) only when the user's presence is detected when the information handling system 100 is in the tablet configuration, a maximum throughput may be realized at times when only no human presence is detected. This increases the efficiency of data transmission by the antenna(s) both in those situations where a user may be harmed by the EM radiation emitted by the antenna(s) and when no harm is imminent. This process may be used to reduce power to any type of antenna operating under any wireless protocols described herein including 4G/5G antennas, Bluetooth antennas, NFC antennas, WiFi antennas and the like regardless of the RFs emitted from those antennas.

In an embodiment, a look-up table may be accessed by the embedded controller 152 or processor 102 in order to determine to what extent the power is reduced if and when human proximity is detected by the repurposed touchpad 122. This look-up table may be maintained on any data storage device described herein. The look-up table may also include data describing which the amount of power to reduce at any of the antenna(s), if any, as well as whether to reduce that power based on the RF emitted by those antenna (s).

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

The information handling system 100 may include one or more of an operating system (OS) 112, and basic input/output system (BIOS) firmware/software 110 or application programs that may be executable instructions 124 executed at any processor 102 and stored at one or more memory devices 104, 106, or 108. BIOS firmware/software 110 functions to initialize the information handling system 100 on power up, to launch an OS 112, and to manage input and output interactions between the OS 112 and the other elements of information handling system 100 including the touchpad 122 described herein. In a particular embodiment, BIOS firmware/software 110 resides in memory 104, and include machine-executable code that is executed by processor 102 to perform various functions of information handling system 100 as described herein. In another embodiment (not illustrated), application programs and BIOS firmware/software 110 reside in another storage medium of the information handling system 100. For example, application programs and BIOS firmware/software 110 can reside in drive 108, in a ROM (not illustrated) associated with the information handling system 100, in an option-ROM (not illustrated) associated with various devices of the information handling system 100, in a storage system (not illustrated) associated with network channel of a wireless interface adapter 128, in another storage medium of the information handling system 100, or a combination thereof. Executable code instructions 124 for application programs and BIOS firmware/software 110 can each be implemented as single programs, or as separate programs carrying out the various features as described herein.

Figure 2A:
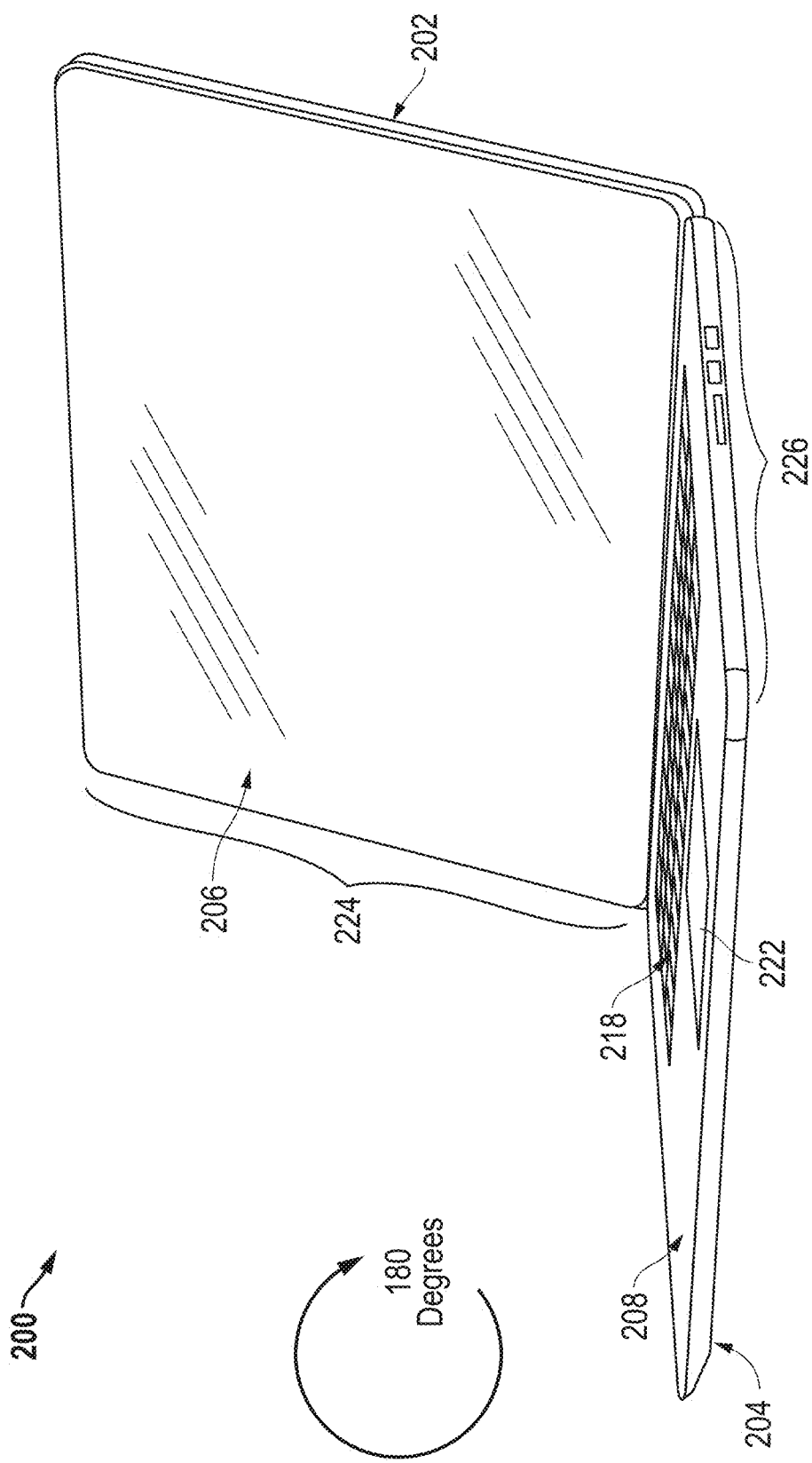
FIG. 2A is a graphic diagram of an information handling system in a clamshell configuration according to an embodiment of the present disclosure.

FIG. 2A is a graphic diagram of an information handling system 200 in a clamshell configuration according to an embodiment of the present disclosure. The chassis (e.g., display chassis 224 and base chassis 226 of the information handling system 200), in an embodiment, may include outer metal cases or shells of for housing internal components within the base chassis 226 of the information handling system 200 such as a cursor control device, a touchpad, a keyboard, a processing device, a disk drive, a cooling system, and components within the display chassis 224 such as a display device and a camera as well as other components described in connection with FIG. 1. As shown in FIG. 2A, the metal chassis may include an a-cover 202 and a b-cover 206 functioning to enclose the video or digital display device and forming the display chassis 224. The metal chassis may further include a c-cover 208 functioning to enclose the cursor control device such as the touchpad 222 and/or the keyboard 218 acting as an alpha numeric input device as well as a d-cover 204 used as a support to hold these and additional information handling system components as described in FIG. 1, for example, therein. In this embodiment, the c-cover 208 and d-cover 204 form the base chassis 226.

FIG. 2A shows the information handling system 200 in a clamshell configuration. In this embodiment, the display chassis 224 including the a-cover 202 and the b-cover 206 may be rotated away from the base chassis 226 including the c-cover 208 and the d-cover 204. When placed in this open configuration, the display chassis 224 may be rotated away from the base chassis 226 about a hinge and placed at an angle less than 180 degrees from the base chassis 226 such that a user may view the display (e.g., FIG. 1, 116) within the b-cover 206 (which may, in an embodiment, include a bezel) and interact with the cursor control device such as the touchpad 222 and/or keyboard 218 within the c-cover 208. In one optional embodiment, the touchpad 222 may be tuned to be used as a proximity device as well as to accept touchpad inputs to the OS for cursor control and other functions. Additionally, proximity sensors may be used to determine human presence near an antenna system in the base chassis for SAR control systems.

Figure 2B:
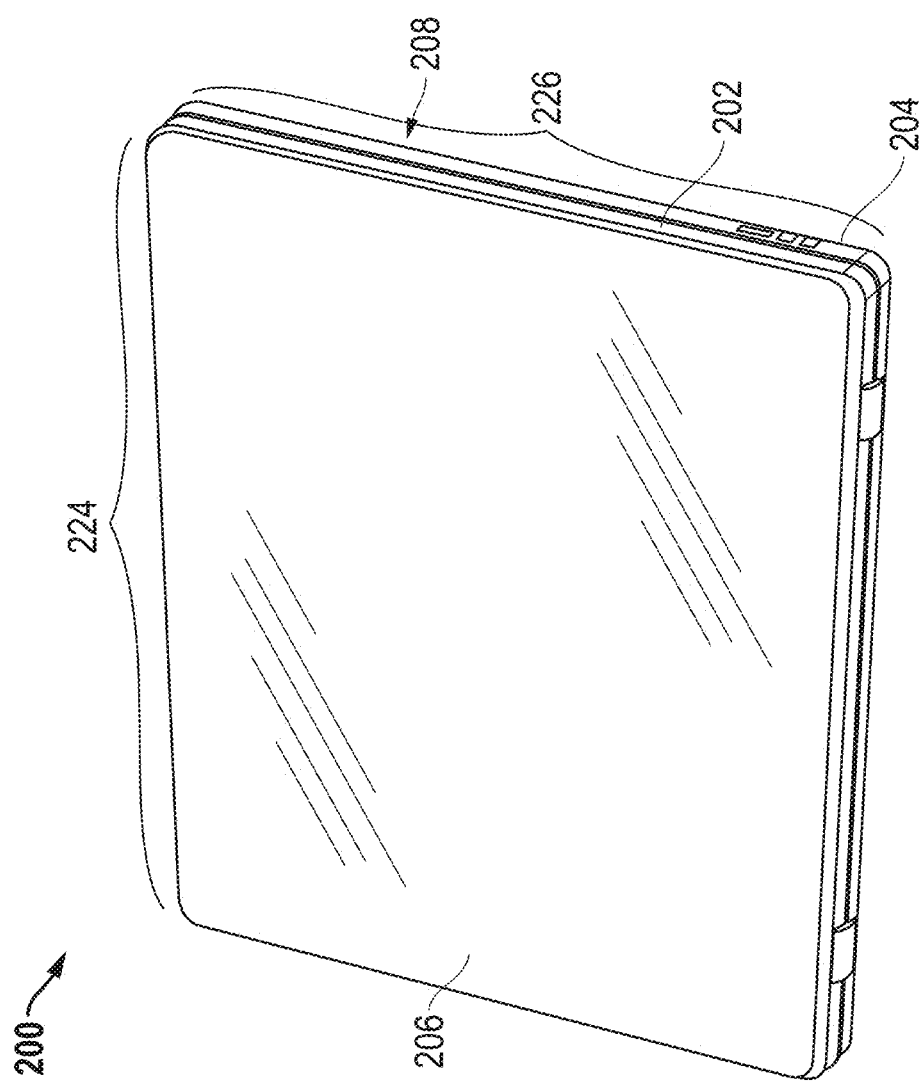
FIG. 2B is a graphic diagram of an information handling system in a tablet configuration according to an embodiment of the present disclosure.

FIG. 2B is a graphic diagram of an information handling system 200 in a tablet configuration according to an embodiment of the present disclosure. In this embodiment, the display chassis 224 including the a-cover 202 and the b-cover 206 may be rotated away from the base chassis 226 including the c-cover 208 and the d-cover 204. When placed in this tablet configuration, the display chassis 224 may be rotated completely away from the base chassis 226 about a hinge and placed at an angle about 360 degrees from the base chassis 226. In this configuration the orientation of the d-cover 204 relative to the a-cover is such that the d-cover 204 and a-cover 202 are against each other such that a user may view the display (e.g., FIG. 1, 116) within the b-cover 206 but is limited in any interaction with the touchpad and/or keyboard 218 within the c-cover 208. In this embodiment, the touchpad (not shown) within the c-cover 208 is inaccessible due to this orientation of the base chassis 226 relative to the display chassis 224. In an embodiment, the touchpad is now on an opposite side of the display device of the display chassis 224 with the touchpad on a surface or on a user's lap when the information handling system 200 is in use. In some embodiments described herein, the touchpad is operatively uncoupled from a controller and driver associated with the touchpad operations when the information handling system is in the tablet configuration shown in FIG. 2B to prevent input from being received at the touchpad. In this embodiment, the touchpad may be utilized, for example, as a proximity sensor to detect a user's lap or hand when the information handling system 200 is being used but while the touchpad is not used to provide touch inputs to the OS.

Figure 3:
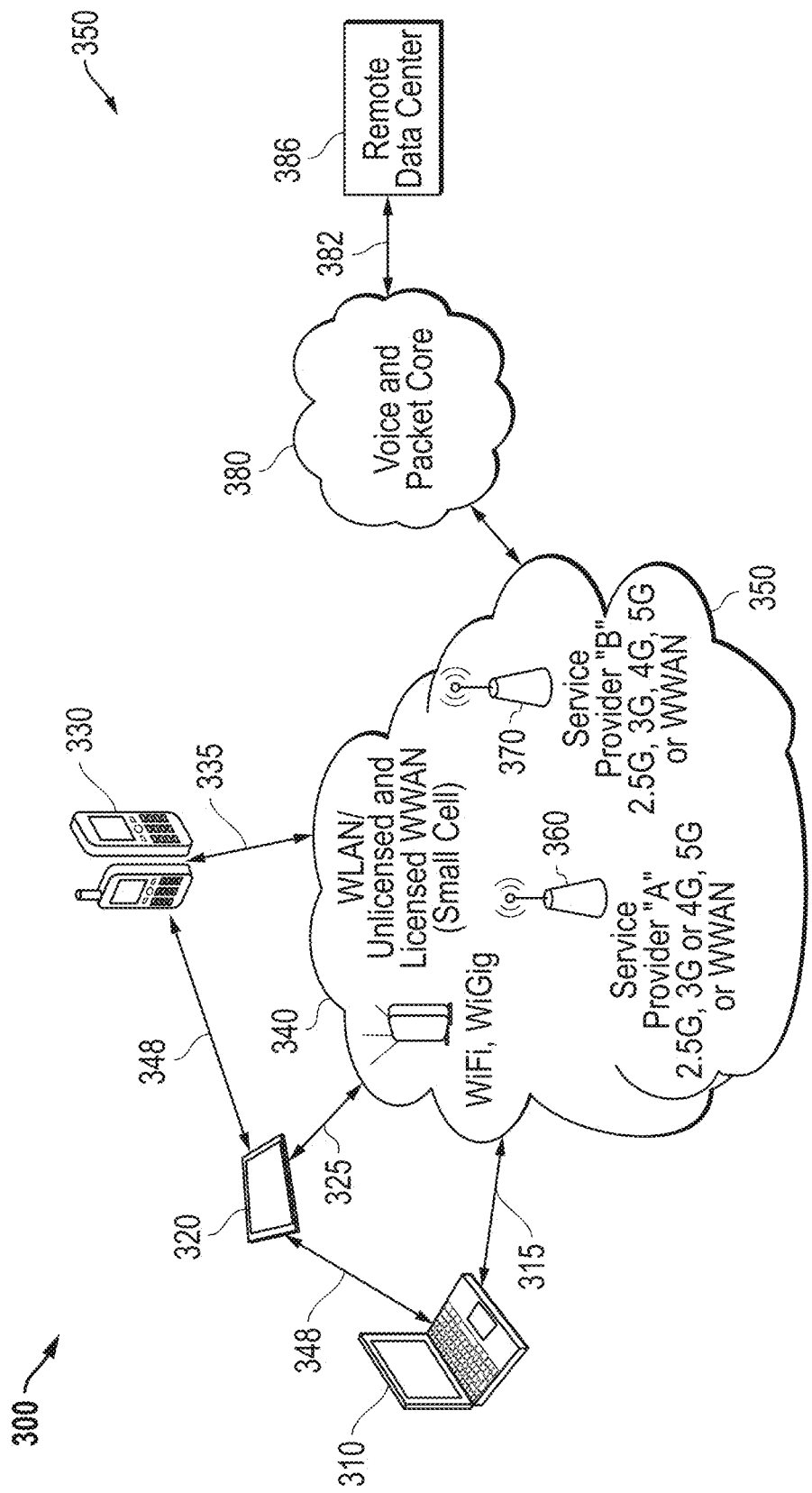
FIG. 3 is a block diagram of a network environment offering several communication protocol options and mobile information handling systems according to an embodiment of the present disclosure.

FIG. 3 illustrates a network 300 that can include one or more endpoint devices 310, 320, 330. The endpoint devices 310, 320, 330 shown in FIG. 3 may be similar to the information handling system 100 described in connection with FIG. 1. In a particular embodiment, network 300 includes networked mobile endpoint devices 310, 320, 330, wireless network access points, and multiple wireless connection link options. A variety of additional computing resources of network 300 may include client mobile information handling systems, data processing servers, network storage devices, local and wide area networks, a RAN service provider, or other resources as needed or desired. As partially depicted, endpoint devices 310, 320, 330 may be a laptop computer, tablet computer, 360-degree convertible systems as described in connection with FIG. 1, wearable computing devices, or a smart phone device. These mobile endpoint devices 310, 320, 330, may access a wireless local network 340, or they may access a macro-cellular network 350. For example, the wireless local network 340 may be the wireless local area network (WLAN), a wireless personal area network (WPAN), or a wireless wide area network (WWAN). In an example embodiment, LTE-LAA WWAN may operate with a small-cell WWAN wireless access point option. In an embodiment, these networks may provide cloud computing resources for the individual mobile endpoint devices 310, 320, 330.

Since WPAN or Wi-Fi Direct connection 348 and WWAN networks can functionally operate similar to WLANs, they may be considered as wireless local area networks (WLANs) for purposes herein. Components of a WLAN may be connected by wireline or Ethernet connections to a wider external network such as a voice and packet core 380. For example, wireless network access points (e.g., FIG. 1, 138) or base stations (e.g., FIG. 1, 140) may be connected to a wireless network controller and an Ethernet switch. Wireless communications across wireless local network 340 may be via standard protocols such as IEEE 802.11 Wi-Fi, IEEE 802.11ad WiGig, IEEE 802.15 WPAN, IEEE 802.11ax-2021, (e.g., Wi-Fi 6 and 6E, 6 GHz technologies), or 5G small cell WWAN communications such as gNodeB, eNodeB, or similar and future wireless network protocols and access points. Alternatively, other available wireless links within network 340 may include macro-cellular connections 350 via one or more service providers 360 and 370. Again, as described herein, the organization of a number of endpoint devices 310, 320, 330 may be defined by the endpoint devices 310, 320, 330 accessing a specific or number of specific base stations. As described herein, the endpoint devices 310, 320, 330 may be operatively coupled to any of the macro-cellular connections 350 via one or more service providers 360 and 370 or to the wireless local area networks (WLANs) selectively. Service provider macro-cellular connections may include 2G standards such as GSM, 2.5G standards such as GSM EDGE and GPRS, 3G standards such as W-CDMA/UMTS and CDMA 2000, 4G standards, or emerging 5G standards including WiMAX, LTE, and LTE Advanced, LTE-LAA, small cell WWAN, upcoming 3GPP protocols, and the like.

Wireless local network 340 and macro-cellular network 350 may include a variety of licensed, unlicensed or shared communication frequency bands as well as a variety of wireless protocol technologies ranging from those operating in macrocells, small cells, picocells, or femtocells. As described herein, utilization of RF communication bands according to several example embodiments of the present disclosure may include bands used with the WLAN standards and WWAN carriers which may operate in both licensed and unlicensed spectrums. For example, both WLAN and WWAN may use the Unlicensed National Information Infrastructure (U-NII) band which typically operates in the ~5 MHz frequency band such as 802.11 a/h/j/n/ac/ax (e.g., center frequencies between 5.170-7.125 GHZ). WLAN, for example, may operate at a 2.4 GHz band, 5 GHz band, and/or a 6 GHz band according to, for example, Wi-Fi, Wi-Fi 6, or Wi-Fi 6E standards. WWAN may operate in a number of bands, some of which are proprietary but may include a wireless communication frequency band. For example, low-band 5G may operate at frequencies similar to 4G standards at 600-850 MHz or, in an embodiment, 960 Mhz. Mid-band 5G may operate at frequencies in an FR1 range between 1.8 and 6 GHz. Additionally, high-band 5G frequencies may operate at 25 to 39 GHz and even higher. In additional examples, WWAN carrier licensed bands may operate at the new radio frequency range 1 (NRFR1), NRFR2, bands, and other known bands as described herein per the operation of the 5G protocol standards for a 5G radio module. Each of these frequencies used to communicate over the network 340 may be based on the radio access network (RAN) standards that implement, for example, eNodeB or gNodeB hardware connected to mobile phone networks (e.g., cellular networks) used to communicate with the endpoint devices 310, 320, 330. In the example embodiment, mobile endpoint devices 310, 320, 330 may also include both unlicensed wireless RF communication capabilities as well as licensed wireless RF communication capabilities. For example, licensed wireless RF communication capabilities may be available via a subscriber carrier wireless service operating the cellular networks. With the licensed wireless RF communication capability, an WWAN RF front end of the endpoint devices 310, 320, 330 may operate on a licensed WWAN wireless radio with authorization for subscriber access to a wireless service provider on a carrier licensed frequency band. WLAN such as Wi-Fi (e.g., Wi-Fi 6) may be unlicensed.

In some embodiments according to the present disclosure, a networked mobile endpoint device 310, 320, 330 may each have a plurality of wireless network interface systems or radio protocol subsystems capable of transmitting simultaneously within several communication bands or even utilizing a shared communication frequency band access multiple protocols. That communication within a shared communication frequency band may be sourced from different protocols on parallel wireless network interface systems or from a single wireless network interface system capable of transmitting and receiving from multiple protocols. Similarly, a single antenna or the plurality of antennas in each endpoint device 310, 320, 330 may be used on each of the wireless communication devices such as according to embodiments herein and may be suited to plural RF bands. As described herein, each of the endpoint devices 310, 320, 330 may include a 5G antenna that are capable of transmitting and receiving data using an FR1 and FR2 frequency concurrently to communicate with multiple networks. Example competing protocols may be local wireless network access protocols such as Wi-Fi/WLAN, WiGig, and small cell WWAN in an unlicensed, shared communication frequency band. Within local portion of wireless network 350 access points for Wi-Fi or WiGig as well as small cell WWAN connectivity may be available in 5G technology or emerging 6G technology. This may create situations where a plurality of antenna systems are operating on an endpoint device 310, 320, 330 via concurrent communication wireless links on both WLAN and WWAN radios and antenna systems. The antenna may be a transmitting antenna that includes high-band, medium-band, low-band, and unlicensed band transmitting antennas in embodiments herein. In an embodiment, the antenna may be an antenna such as described in connection with FIG. 1. The antenna may cooperate with other antennas in a N×N MIMO (where "N" is any number) array configuration according to the embodiments described herein. Alternatively, embodiments may include a single transceiving antenna capable of receiving and transmitting, and/or more than one transceiving antennas. Each of the antennas included in the endpoint devices 310, 320, 330 in an embodiment may be subject to the FCC regulations on SAR with which the human proximity sensing system described herein with its touchpad, platform control hub, ISH, and power-tables, among other components, is used to control these SAR levels.

The voice and packet core network 380 shown in FIG. 3 may contain externally accessible computing resources such as containerize applications that may execute at edge compute resources 384 or connect to a remote data center 386. The voice and packet core network 380 may contain multiple intermediate web servers or other locations with accessible data (not shown). The voice and packet core network 380 may also connect to other wireless networks similar to 340 or 350 and additional mobile endpoint devices 310, 320, 330 or similar connected to those additional wireless networks. Connection 382 between the wireless network 340 and edge compute resources 384 or remote data center 386 or connection to other additional wireless networks may be via Ethernet or another similar connection to the world-wide-web, a WAN, a LAN, another WLAN, or other network structure. Such a connection 382 may be made via a WLAN access point/Ethernet switch to the external network and includes a backhaul connection. The access point may be connected to one or more wireless access points in the WLAN before connecting directly to a mobile information handling system or may connect directly to one or more mobile endpoint devices 310, 320, 330. Alternatively, mobile endpoint devices 310, 320, 330 may connect to the external network via base station locations at service providers such as 360 and 370. These service provider locations may be network connected via backhaul connectivity through the voice and packet core network 380.

Remote data centers 386 may include web servers or resources within a cloud environment that operate via the voice and packet core 380 or other wider internet connectivity. For example, remote data centers 386 can include additional information handling systems, data processing servers, network storage devices, local and wide area networks, or other resources as needed or desired. In an embodiment, the remote data center 386 may include one or more servers.

Edge compute systems 384, in an embodiment, may be used to offload processing requirements for each of the mobile endpoint devices 310, 320, 330 described herein. In this embodiment, the edge compute systems 384 may be any computing system or distributed computing systems that places the processing and data storage resources within the network 340 and 350 closer to the mobile endpoint devices 310, 320, 330 to improve response times and save bandwidth while offloading processing of data from the mobile endpoint devices 310, 320, 330 to these edge compute systems 384. In an embodiment, containerized software applications may be executed on the edge compute systems 384 as a bundle of application code, files, libraries, and dependencies used to execute those containerized software applications. During operation of the mobile endpoint devices 310, 320, 330, any applicable containerized software application may be accessed by the respective processing devices in the mobile endpoint devices 310, 320, 330.

Having such edge compute or remote capabilities may permit fewer resources to be maintained at the mobile endpoint devices 310, 320, 330 allowing streamlining and efficiency within those devices. Similarly, remote data center permits fewer resources to be maintained in other parts of network 300. Thus, high data bandwidth wireless links are desired for endpoint devices 310, 320, 330 to interface with greater and greater resources located on a network edge or as a remote data center. This requires more antennas, more power, and more heat, in less space within the endpoint devices 310, 320, 330.

Although network connections 315, 325, and 335 are shown connecting wireless adapters of mobile endpoint devices 310, 320, 330 to wireless networks 340 or 350, a variety of wireless links are contemplated. Wireless communication may link through a wireless access point (Wi-Fi or WiGig), through unlicensed WWAN small cell base stations such as in network 340 or through a service provider tower and base stations such as that shown with service provider A 360 or service provider B 370 and in network 350. In other aspects, mobile endpoint devices 310, 320, 330 may communicate intra-device via intra-device connections 348 when one or more of the mobile endpoint devices 310, 320, 330 are set to act as an access point or even potentially an WWAN connection via small cell communication on licensed or unlicensed WWAN connections. For example, one of the endpoint devices 310, 320, 330 may serve as a Wi-Fi hotspot in an embodiment. Concurrent wireless links to the endpoint devices 310, 320, 330 may be connected via any access points including other mobile information handling systems as illustrated in FIG. 3.

Figure 4:
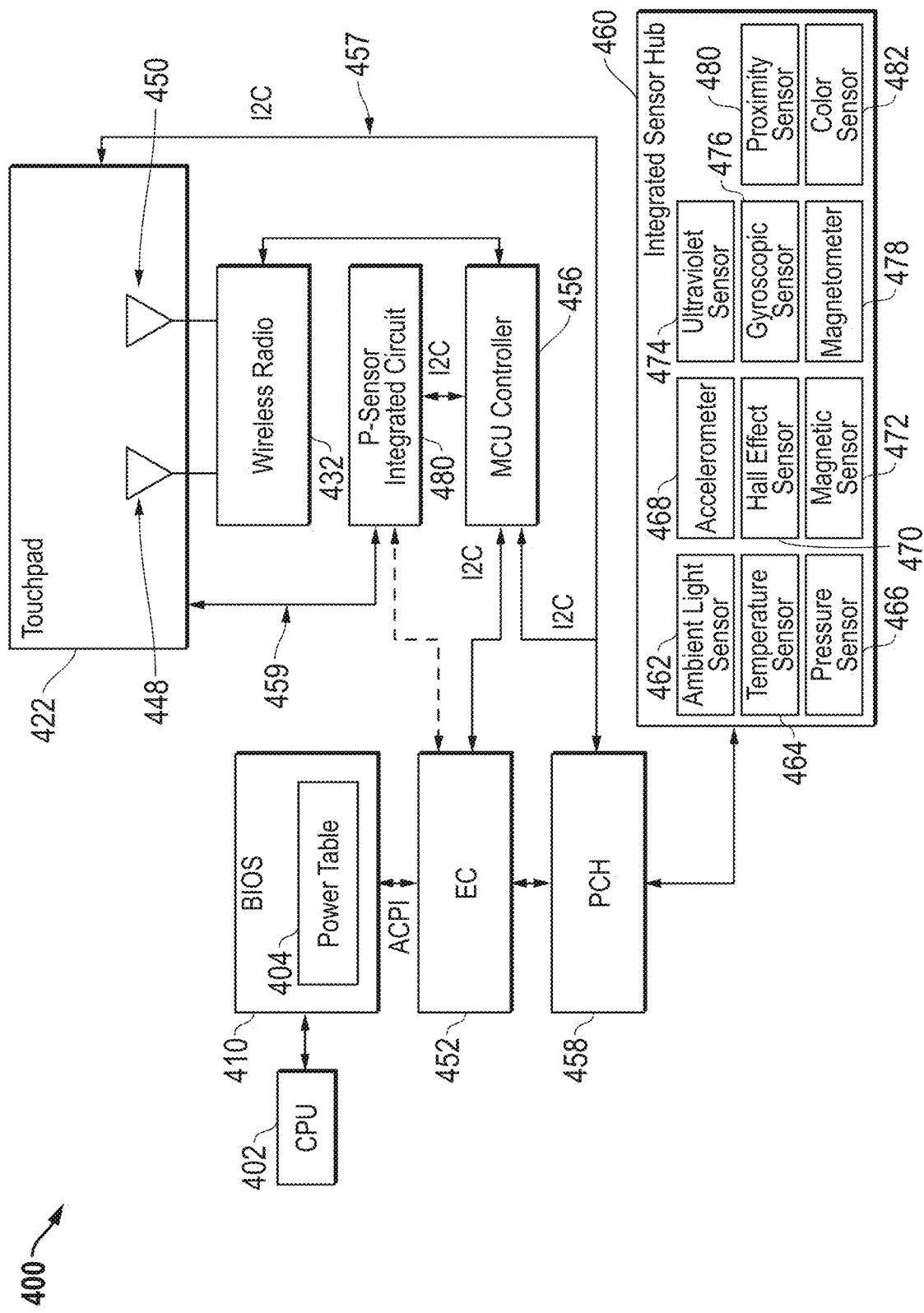
FIG. 4 is a block diagram of a human proximity sensing system utilizing a touchpad according to an embodiment of the present disclosure.

FIG. 4 is a block diagram of a human proximity sensing system 400 utilizing a touchpad 422 according to an embodiment of the present disclosure. As described herein, the human proximity sensing system 400 may be used to initially determine when an information handling system is placed in a tablet configuration in order to repurpose the touchpad 422 to operate as a proximity sensor. By repurposing the touchpad 422 to operate as a proximity sensor when the information handling system is in a tablet configuration, the proximity of a user relative to an antenna may be determined in order to reduce power to that antenna and, thereby, reduce the SAR to the user. This increases the safety of the user during operation of the information handling system while still prioritizing for the highest data throughput to a network using the wireless radios 432 and antennas in the information handling system, when possible, without human proximity.

During operation, the platform control hub 458 may receive data from a number of sensors that help to determine when the information handling system is placed in the tablet configuration. These sensors may be operated using an ISH 460. In an example embodiment, the ISH 460 may include a temperature sensor 464, a pressure sensor, a Hall effect sensor 470, a magnetic sensor 472, a magnetometer 478, an accelerometer 468, a hinge sensor, a light sensor (e.g., ultraviolet light sensor 474, IR light sensor, ambient light sensor 462, color sensor 482), a gyroscopic sensor 476, a camera, and a proximity sensor 480, among others. Any of these sensors may provide data to an ISH 460 which provides that data to the platform control hub 458. In an example embodiment, a hall effect sensor 470, via a first portion of the chassis, may be used to detect a magnetic field from one or more magnets placed within a second portion of the chassis of the information handling system. For example, a magnet may be placed in a display chassis on an interior surface of the a-cover. In this embodiment, the Hall effect sensor 470 may be placed in the base chassis on an interior surface of the d-cover. When the back side of the base chassis (e.g., the d-cover) comes close to and/or abuts the display chassis (e.g., a-cover) thereby indicating that the information handling system has been placed in a tablet configuration, the Hall effect sensor 470 may detect the magnetic field at the magnet in the display chassis. When the Hall effect sensor 470 detects this magnetic field, it may send a signal to the ISH 460 which forwards the signal indication to the platform controller hub (PCH) 458, a set of chips for control of data paths relating to support functions for the CPU and other processors, for utilization by the microcontroller (e.g., MCU controller 456), embedded controller 452 and/or processor in order to indicate that the information handling system 400 has been placed in the tablet configuration. Otherwise, the PCH 458 determines that the information handling system 400 is in another configuration such as a clamshell configuration.

Other example embodiments may include the use of the other sensors in the information handling system 400 in order to determine the configuration of the information handling system 400 that includes, at least, a tablet configuration or a clamshell configuration. In an example embodiment, an accelerometer 468, a magnetometer 478, a magnetic sensor 472, or the like may be used to detect the configuration of any portion of the chassis of the information handling system 400 (e.g., display chassis and base chassis) relative to a reference position or another portion of the chassis based on a detected reference direction such as "up" or "north" in order to determine the configuration of the information handling system 400. This information gathered at the ISH 460 may be used individually or in combination to determine if and when the information handling system 400 is in a clamshell configuration or a tablet configuration or another configuration.

When the PCH 458 has received input from these sensors indicating that the information handling system is in a tablet configuration, the platform control hub 458 may send a signal to the embedded controller 452. In an embodiment, the embedded controller 452 may be the processing device used to control the repurposing of the touchpad 422 as described herein. In this embodiment, because the embedded controller 452 may operate below the execution of the OS, the embedded controller 452 may act regardless of the software or other hardware being executed at any given time on the information handling system. In an embodiment, the embedded controller 452 may direct the platform control hub 458 to send the signals indicating the information handling system is in a tablet configuration directly to a microcontroller unit (MCU) 456 so that the MCU 456 can direct a proximity sensor integrated circuit (P-sensor IC) 480 to be operatively coupled to the touchpad 422 in order to repurpose the metallic layers of the touchpad 422 as a proximity sensor. In an embodiment, the MCU controller 456 may also turn off the touchpad 422 from receiving touch input upon a determination that the information handling system 400 is in the tablet configuration. In this embodiment, the touch signals at the touchpad 422 will no longer be recorded and processed by the MCU controller 456 for communication to the touchpad driver software of the operating system and by the CPU 402.

It is appreciated that the embedded controller 452, platform control hub 458, and MCU 456 may communicate with each other and the P-sensor IC 480 via any serial communication bus such as an inter-integrated circuit (I²C) line 457. For example, this I²C communication may be used when the MCU 456, the embedded controller 452, and platform control hub 458 are on a nearby or the same printed circuit board (PCB) in an embodiment.

During operation and when the embedded controller 452 has received the signal from the platform control hub 458 that the information handling system is in a tablet configuration, the MCU 456 directs the P-sensor IC 480 to be operatively coupled to the touchpad 422 via a proximity sensor line 459. Proximity sensor line 459 may, when the information handling system 400 is in any configuration other than a tablet configuration (e.g., a clamshell configuration), be operatively coupled to the antennas 448, 450 of the wireless radio 432 or one or more dedicated proximity sensors (not shown) in order to detect the presence of a user and operation of the antennas 448, 450. The MCU 456 may be directed by the embedded controller 452 to either continue to use the antennas 448, 450 or other proximity sensors even when the information handling system is in a tablet configuration in some embodiments. When in the tablet configuration, however, the platform control hub 458 may, via a I²C serial communication I²C line 457, direct the MCU controller 456 or EC 452 to disable the touchpad 422 from a processing device executing a touchpad driver such as the CPU 402 form receiving touch input such as for cursor control and be, instead, coupled to the P-sensor IC 480 for use as an additional proximity sessor or the only proximity sensor. This may be done by operatively coupling the metallic layers of the touchpad 422 to the P-sensor IC 480 so that the changes in capacitance around the surface of the touchpad 422 may be detected by the P-sensor IC 480. The uncoupling of the touchpad 422 from the processor such as the CPU 402 executing the touchpad driver may be controlled by the embedded controller 452 or MCU controller 456 in various embodiments.

As the P-sensor IC 480 is operatively coupled to the metallic layers of the touchpad 422, the P-sensor IC 480 may provide human proximity detection signals to the embedded controller 452. The embedded controller 452, when these signals are received, addresses a power table 404 at the BIOS 410 in order to determine if and to what extent power to the antennas 448, 450 should be reduced in order to protect the user from physical harm from the EM radiation emitted from these antennas 448, 450 and conform to industry SAR standards. This power table (also referred to herein as a look-up table) may include data describing which the amount of power to reduce at any of the antennas 448, 450, if any, as well as whether to reduce that power based on the RF emitted by those antennas 448, 450. As described herein, the power table 404 may be used to cross-reference the type of antennas 448, 450 being used, the RF emitted by the antennas 448, 450, and what distance from the antennas 448, 450 the human proximity is detected. Each of these factors along with others may be addressed at the look-up table by the embedded controller 452 in order to determine if and to what extent the power is to be reduced at the antennas 448, 450. This process may continue with the P-sensor IC 480 detecting whether the touchpad 422, repurposed as a proximity sensor while in a tablet configuration, has detected human presence or not and addressing the power provided to the antennas 448, 450. It is appreciated that when human proximity is not detected, the power provided to the antennas 448, 450 to transceive data is not reduced so that an optimal data throughput may be realized. In a specific embodiment, an advanced configuration and power interface (ACPI) may be implemented to assist the embedded controller 452 to perform this power management as it relates to the amount of power provided to the antennas 448, 450.

When the information handling system is detected as in a clamshell configuration, the touchpad 422 may tuned to operate as a proximity sensor to detect a human body part near the touchpad surface as well as be tuned to accept touch inputs at the touchpad from a user. For example, when the information handling system is in the clamshell configuration, the touchpad 422 may be tuned to detect a user's hand or finger as it approaches the touchpad 422 for proximity as well as tuned differently to detect the touch of a user's finger on the touchpad 422 for receiving a touchpad input command for a software application or cursor control as described herein. In an embodiment, the touchpad may be tuned to detect both near presence (e.g., 20 mm or above away from the touchpad) and a touch at the touchpad. For example, the touchpad 422 may be operatively coupled to the P-sensor integrated circuit 480, such as via proximity sensor line 459, to detect the human presence via detected changes in the capacitance in the metallic layers of the touchpad, the level of change in the capacitance may be different as a user's body part approaches the touchpad as compared to as when a user's body (e.g., a finger) contacts the surface of the touchpad. This may indicate proximity to antennas 448 or 450. For touch input intended for use with a software application or the OS, such as for cursor control, a different threshold of capacitance may be detected via the PCH 458 for processing and interpretation as touch commands by the EC 452 or for the CPU 402. These different levels of change in capacitance may be threshold levels that when reached indicate human proximity (e.g., a first capacitive threshold) or human touch at the touchpad (e.g., a second capacitive threshold). As described herein, a look-up table may include data descriptive of the first capacitive threshold and the second capacitive threshold and may be used by, for example, the embedded controller 452 or MCU 456 to determine whether a proximity event is detected (e.g., human proximity is detected) near the touchpad.

Figure 5:
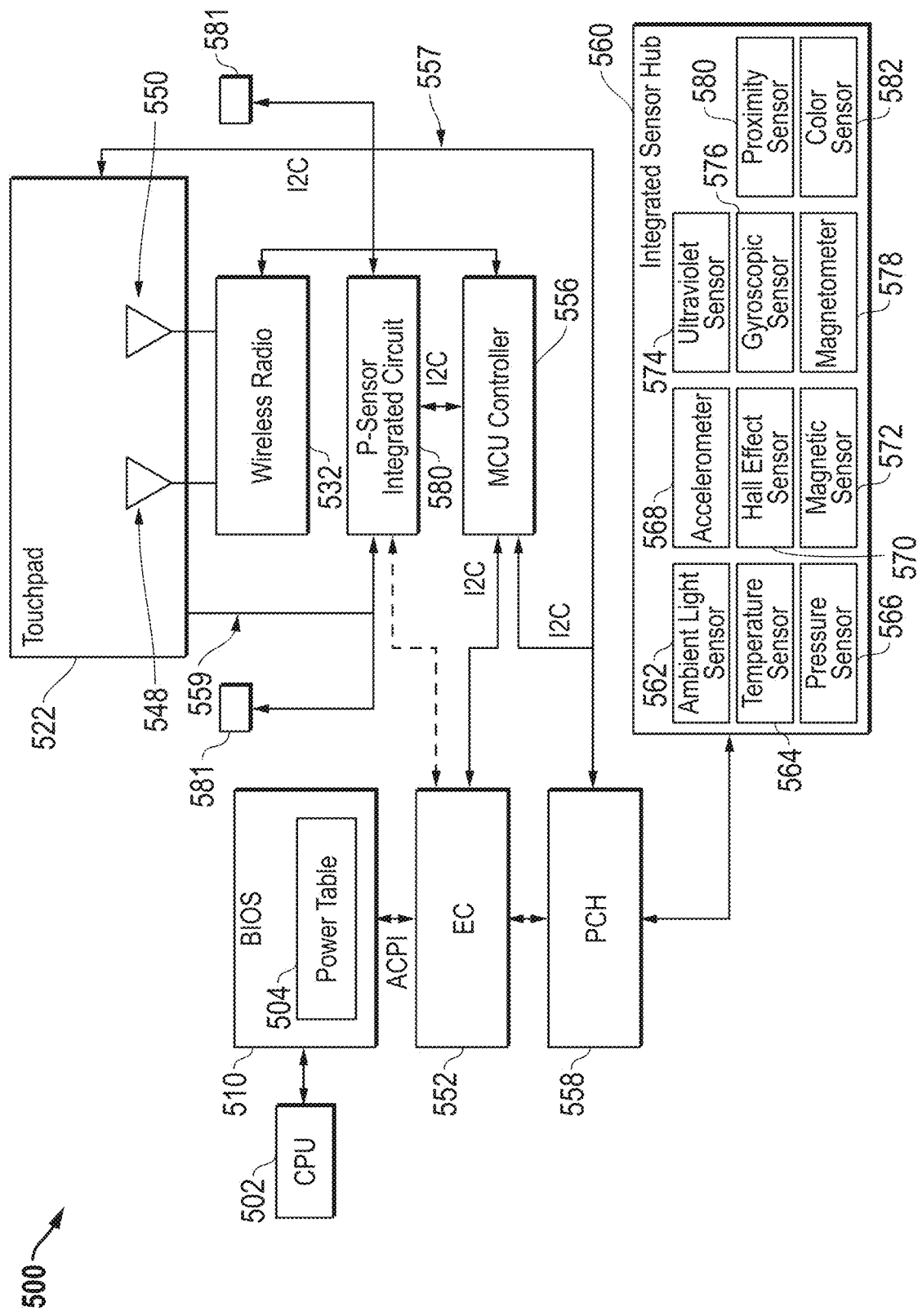
FIG. 5 is a block diagram of a human proximity sensing system utilizing a touchpad according to another embodiment of the present disclosure.

FIG. 5 is a block diagram of a human proximity sensing system 500 utilizing a touchpad 522 according to another embodiment of the present disclosure. Again, the human proximity sensing system 500 may be used to initially determine when an information handling system is placed in a tablet configuration in order to repurpose the touchpad 522 to operate as a proximity sensor. FIG. 5 includes additional circuitry used to operate the touchpad 522 as an input device and utilize separately disposed proximity sensors 581 for human proximity sensing as described herein when the information handling system 500 is not in a tablet configuration.

By repurposing the touchpad 522 to operate as a proximity sensor when the information handling system 500 is in a tablet configuration, the proximity of a user relative to an antenna may be determined in order to reduce power to that antenna and, thereby, reduce the SAR to the user. This increases the safety of the user during operation of the information handling system 500 while still prioritizing for the highest data throughput to a network using the wireless radios 532 and antennas in the information handling system 500 when human proximity is not detected in a tablet configuration.

During operation, the platform control hub 558 may receive data from a number of sensors that help to determine when the information handling system 500 is placed in the tablet configuration. These sensors may be operated using an ISH 560 similar to that described in connection with FIGS. 1 and 4. In an example embodiment, the ISH 560 may include a temperature sensor 564, a pressure sensor 566, a Hall effect sensor 570, a magnetic sensor 572, a magnetometer 578, an accelerometer 568, a hinge sensor, a light sensor (e.g., ultraviolet light sensor 574, IR light sensor, ambient light sensor 562, color sensor 582), a gyroscopic sensor 576, a camera, and a proximity sensor 580, among others. Each of these sensors may provide data to an ISH 560 which provides that data to the PCH 458. Embodiments are described herein include the use of any of these sensors in the information handling system 500 in order to determine the configuration of the information handling system 500 that includes, at least, a tablet configuration or a clamshell configuration.

When the PCH 558 has received input from these sensors indicating that the information handling system 500 is in a clamshell configuration, the PCH 558 may provide this data to the embedded controller 352. The embedded controller 552 may then direct a P-sensor IC 580 to detect the presence of a user or other human near the antennas 548, 550 using one or more proximity sensors 581 disposed at a different locations within the information handling system 600 chassis, e.g., the bottom or side of the base chassis or d-cover than the touchpad 522. These proximity sensors 581 may be placed at or near one or more antennas 548, 550 in these different locations so that the human presence can be detected at the antennas 548, 550 in configurations other than a tablet configuration. When the P-sensor IC 580 detects the presence of a human, the embedded controller 552 may access the power table 504 (also called a look-up table) in order to determine if and to what degree to reduce power to the antennas 548, 550 as described herein.

When the PCH 558 has received input from these sensors indicating that the information handling system 500 is in a tablet configuration, the platform control hub 558 may send a signal to the embedded controller 552. In an embodiment, the embedded controller 552 may be the processing device used to control the repurposing of the touchpad 522 as described herein. In this embodiment, because the embedded controller 552 may operate below the execution of the OS, the embedded controller 552 may act regardless of the software or other hardware being executed at any given time on the information handling system 500. In an embodiment, the embedded controller 552 may direct the platform control hub 558 to send the signals indicating the information handling system 500 is in a tablet configuration directly to a microcontroller unit (MCU) 556 so that the MCU 556 can direct a P-sensor IC 580 to be operatively coupled to the touchpad 522 in order to repurpose the metallic layers of the touchpad 522 as a proximity sensor. In an embodiment, the MCU controller 556 may also turn off the touchpad 522 from receiving touch input upon a determination that the information handling system 500 is in the tablet configuration. In this embodiment, the touch signals at the touchpad 522 will no longer be recorded and processed by the MCU controller 556 for communication to the touchpad driver software of the operating system and by the CPU 502.

It is appreciated that the embedded controller 552, platform control hub 558, and MCU 556 may communicate with each other and the P-sensor IC 580 via any serial communication bus such as an inter-integrated circuit (I²C) line 557. This I²C communication line 557 may be used when the MCU 556, the embedded controller 552, and platform control hub 558 are on a nearby or the same printed circuit board (PCB).

During operation and when the embedded controller 552 has received the signal from the PCH 558 that the information handling system 500 is in a tablet configuration, the MCU 556 directs the P-sensor IC 580 to be operatively coupled to the touchpad 522 via a proximity sensor line 559 and activate sensing via this line 559. This proximity sensor line 559 may, when the information handling system 500 is in any configuration other than a tablet configuration (e.g., a clamshell configuration), be operatively coupled to the antennas 548, 550 of the wireless radio 532 or to one or more dedicated proximity sensors 581 disposed in a different location on the information handling system 500 chassis in order to detect the presence of a user and operating of the antennas 548, 550. In an embodiment, the MCU 556 may be directed by the embedded controller 552 to either continue to use the antennas 548, 550 or other proximity sensors 581 even when the information handling system 500 is in a tablet configuration in some embodiments. When in the tablet configuration, however, the platform control hub 558 may, via a I²C serial communication I²C line 557, direct the MCU controller 556 or EC 552 to uncouple the touchpad from a processing device executing a touchpad driver such as the CPU 502 and be, instead, coupled to the P-sensor IC 580 for use as an additional proximity sensor or the only proximity sensor. This may be done by operatively coupling the metallic layers of the touchpad 522 to the P-sensor IC 580 so that the changes in capacitance around the surface of the touchpad 522 may be detected by the P-sensor IC 580. The uncoupling of the touchpad 522 from the processor such as the CPU 502 executing the touchpad driver may be controlled by the embedded controller 552 or the MCU controller 556 in various embodiments.

As the P-sensor IC 580 is operatively coupled to the metallic layers of the touchpad 522, the P-sensor IC 580 may provide human proximity detection signals to the embedded controller 552. The embedded controller 552, when these signals are received, addresses a power table 504 at the BIOS 510 in order to determine if and to what extent power to the antennas 548, 550 should be reduced in order to protect the user from physical harm from the EM radiation emitted from these antennas 548, 550 and conform to industry SAR standards. This power table (also referred to herein as a look-up table) may include data describing which the amount of power to reduce at any of the antennas 548, 550, if any, as well as whether to reduce that power based on the RF emitted by those antennas 548, 550. As described herein, the power table 504 may be used to cross-reference the type of antennas 548, 550 being used, the RF emitted by the antennas 548, 550, and what distance from the antennas 548, 550 the human proximity is detected. Each of these factors along with others may be addressed at the look-up table by the embedded controller 552 in order to determine if and to what extent the power is to be reduced at the antennas 548, 550. This process may continue with the P-sensor IC 580 detecting whether the touchpad 522, repurposed as a proximity sensor, has detected human presence or not and addressing the power provided to the antennas 548, 550. It is appreciated that when human proximity is not detected, the power provided to the antennas 548, 550 to transceive data is not reduced so that an optimal data throughput may be realized. In a specific embodiment, an advanced configuration and power interface (ACPI) may be implemented to assist the embedded controller 552 to perform this power management as it relates to the amount of power provided to the antennas 548, 550.

Figure 6:
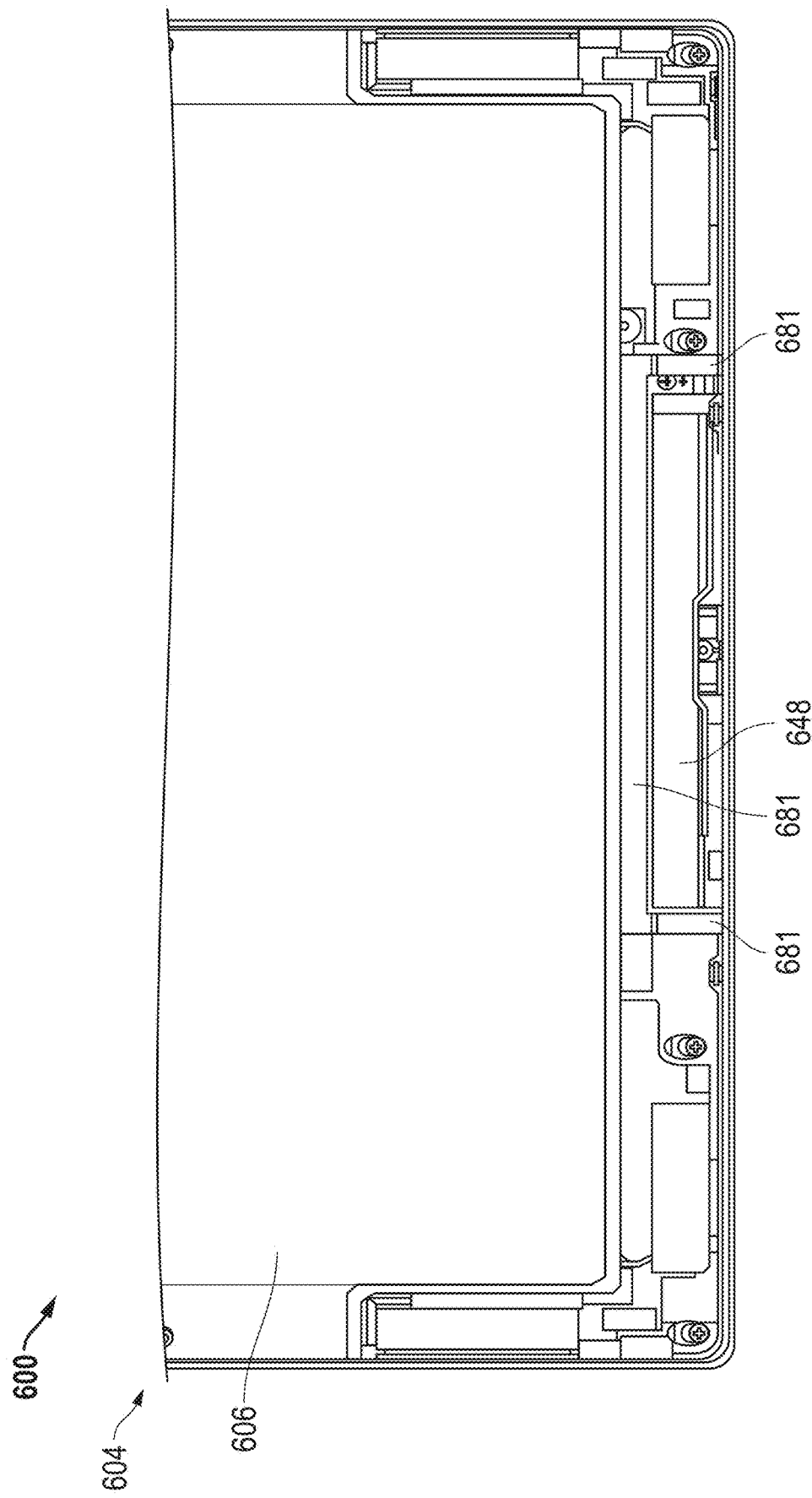
FIG. 6 is a graphic diagram of a bottom view of a base chassis of an information handling system according to an embodiment of the present disclosure.

FIG. 6 is a graphic diagram of a bottom view of a base chassis 604 of an information handling system 600 according to an embodiment of the present disclosure. The bottom view shows a d-cover 606 of the base chassis 604 as described herein with a portion of the d-cover 606 removed to expose various components within this base chassis.

Among these components, the base chassis 604 may include an antenna 648. As described herein, the antenna 648 may be any type of antenna that transceives data wirelessly to a network. For example, the information handling system 600, in an embodiment of the present disclosure, may employ separate antenna systems for Wi-Fi signals, wireless wide area network (WWAN) signals, Bluetooth signals, and wireless local area network (WLAN) signals any of which may be represented by the antenna 648 in FIG. 6. The RF signals associated with the types of these antennas and their associated systems (e.g., radios and wireless interface adapter) may vary depending on the type of antenna 648 used.

The example embodiment shown in FIG. 6 shows a single antenna 648 placed toward a front portion of the base chassis of the information handling system 600. This location may be at or near a touchpad (not shown) formed in a c-cover chassis of the base chassis 604. As described herein, the antenna 648 may transmit through a portion of the touchpad via, for example, a latticed window formed in one or more layers (e.g., metallic layers) of the touchpad. However, the present specification contemplates that the principles, methods, and systems described herein may apply equally to other antennas formed at other locations within the display chassis or base chassis.

In the example embodiment shown in FIG. 6, the antenna 648 may be near a proximity sensor 680. In the embodiment shown in FIG. 6, the proximity sensor 680 wraps around the antenna and is used to determine whether human proximity is detected. As described herein, when human proximity is detected, the proximity sensor 680 may send a signal to an integrated sensor hub and/or a processing device (e.g., an embedded controller or a microcontroller) to reduce the amount of power provided to the antenna 648 in order to reduce the SAR. According to the embodiments of the present disclosure, the use of the proximity sensor 680 or repurposing the metallic layers of the touchpad as the proximity sensor or as an additional proximity sensor may depend on detected configuration of the information handling system 600. In an embodiment, the proximity sensors 681 may be used to detect a proximity of a human body part when the information handling system 600 is in various configurations, e.g., clamshell configuration. As described herein, this repurposing of the metallic layers of the touchpad is done as additional sensors (e.g., hall effect sensor, hinge sensor, accelerometer, etc.) detect that the information handling system 600 is placed into a tablet configuration. It is appreciated, as well, that the information handling system 600 includes additional antennas placed within the base chassis 604 and/or display chassis (not shown) and can be similarly affected by the operations of the processing devices and various configurations described herein.

Figure 7:
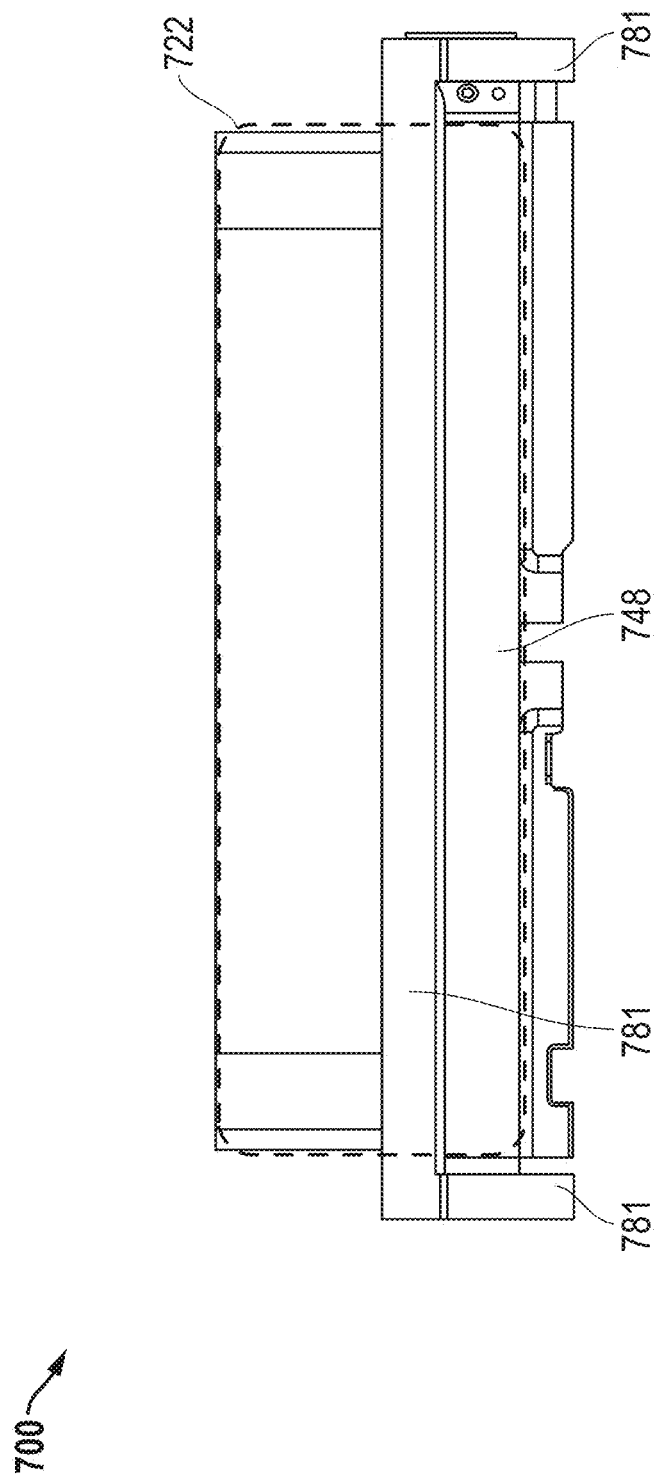
FIG. 7 is a graphic diagram of a top view of a base chassis of an information handling system indicating a location of a touchpad according to an embodiment of the present disclosure.

FIG. 7 is a graphic diagram of a top view of a base chassis 704 of an information handling system 700 according to another embodiment of the present disclosure. FIG. 7 is a closer view of the antenna 748 and the proximity sensor 781 as shown in FIG. 6. FIG. 7 further includes depictions of a touchpad location 722 on a c-cover shown in a dashed line and placed behind the antenna 748 and proximity sensor 781. Because FIG. 7 shows a top view of the base chassis 704, the c-cover has been removed leaving the antenna 748 and proximity sensor 781 exposed for viewing and the touchpad location 722 shown in a dashed line and placed behind them.

As described herein, the placement of the touchpad location 722 relative to the antenna 748 does not inhibit, when the information handling system 700 is in a clamshell configuration, the transception with the antenna 748. Instead, the layers (e.g., metallic layers) of the touchpad location 722 that cover the antenna 748 or portions of the antenna 748 on the c-cover may be formed into a latticed window as described further in embodiments herein. This latticed window may allow the RF signals emitted by the antenna 748 and those RF signals received at the antenna 748 from an access point or base station to be sent by and received at the antenna 748. This latticed window may also include the metallic layers that each include conductors used to detect a change in a proportional capacitance at any location over the surface of the touchpad location 722 to provide for touchpad input functions as well to a touchpad driver.

As described in embodiments herein, touchpad location 722 (e.g., the metallic layers of the touchpad location 722) may be repurposed to operate as a proximity sensor when the information handling system 700 is placed in a tablet configuration by the user. In these embodiments, the proximity of a user relative to the antenna 748 may be determined in order to reduce power to that antenna 748 and, thereby, reduce the SAR the user is subjected to. This increases the safety of the user during operation of the information handling system while still prioritizing for the highest data throughput to a network using the wireless radios and antennas in the information handling system.

During operation of the information handling system 700, a platform control hub may receive data from a number of sensors that help to determine when the information handling system is placed in the tablet configuration. These sensors may be operated using an ISH similar to that described herein. In an example embodiment, the ISH may include a temperature sensor, a pressure sensor, a Hall effect sensor, a magnetic sensor, a magnetometer, an accelerometer, a hinge sensor, a light sensor (e.g., ultraviolet light sensor, IR light sensor, ambient light sensor, color sensor), a gyroscopic sensor, a camera, and a proximity sensor, among others. Any of these sensors may provide data to an ISH which provides that data to the platform control hub. Embodiments described herein include the use of one or more of these sensors in the information handling system in order to determine the configuration of the information handling system of a first portion of the information handling system 700 chassis to a second portion of the information handling system 700 chassis that includes, at least, a tablet configuration or a clamshell configuration.

When the PCH has received input from these sensors indicating that the information handling system is in a clamshell configuration, the PCH may provide this data to the embedded controller. The embedded controller may then direct a P-sensor IC to detect the presence of a user or other human near the antennas using one or more proximity sensors 781. These proximity sensors 781 may be placed at or near one or more antennas 748 so that the human presence can be detected at the antennas 748. When the P-sensor IC detects the presence of a human, the embedded controller may access the power table (also called a look-up table) in order to determine if and to what degree to reduce power to the antennas 748 as described herein.

When the PCH has received input from these sensors indicating that the information handling system is in a tablet configuration, the platform control hub may send a signal to the embedded controller. In an embodiment, the embedded controller may be the processing device used to control the repurposing of the touchpad as described herein. In this embodiment, because the embedded controller may operate below the execution of the OS, the embedded controller may act regardless of the software or other hardware being executed at any given time on the information handling system. In an embodiment, the embedded controller may direct the platform control hub to send the signals indicating the information handling system is in a tablet configuration directly to a microcontroller unit (MCU) so that the MCU can direct a P-sensor IC to be operatively coupled to the touchpad location 722 in order to repurpose the metallic layers of the touchpad location 722 as a proximity sensor. In an embodiment, the MCU controller may also turn off the touchpad from receiving touch input upon a determination that the information handling system 700 is in the tablet configuration. In this embodiment, the touch signals at the touchpad will no longer be recorded and processed by the MCU controller for communication to the touchpad driver software of the operating system and by the CPU.

Figure 8:
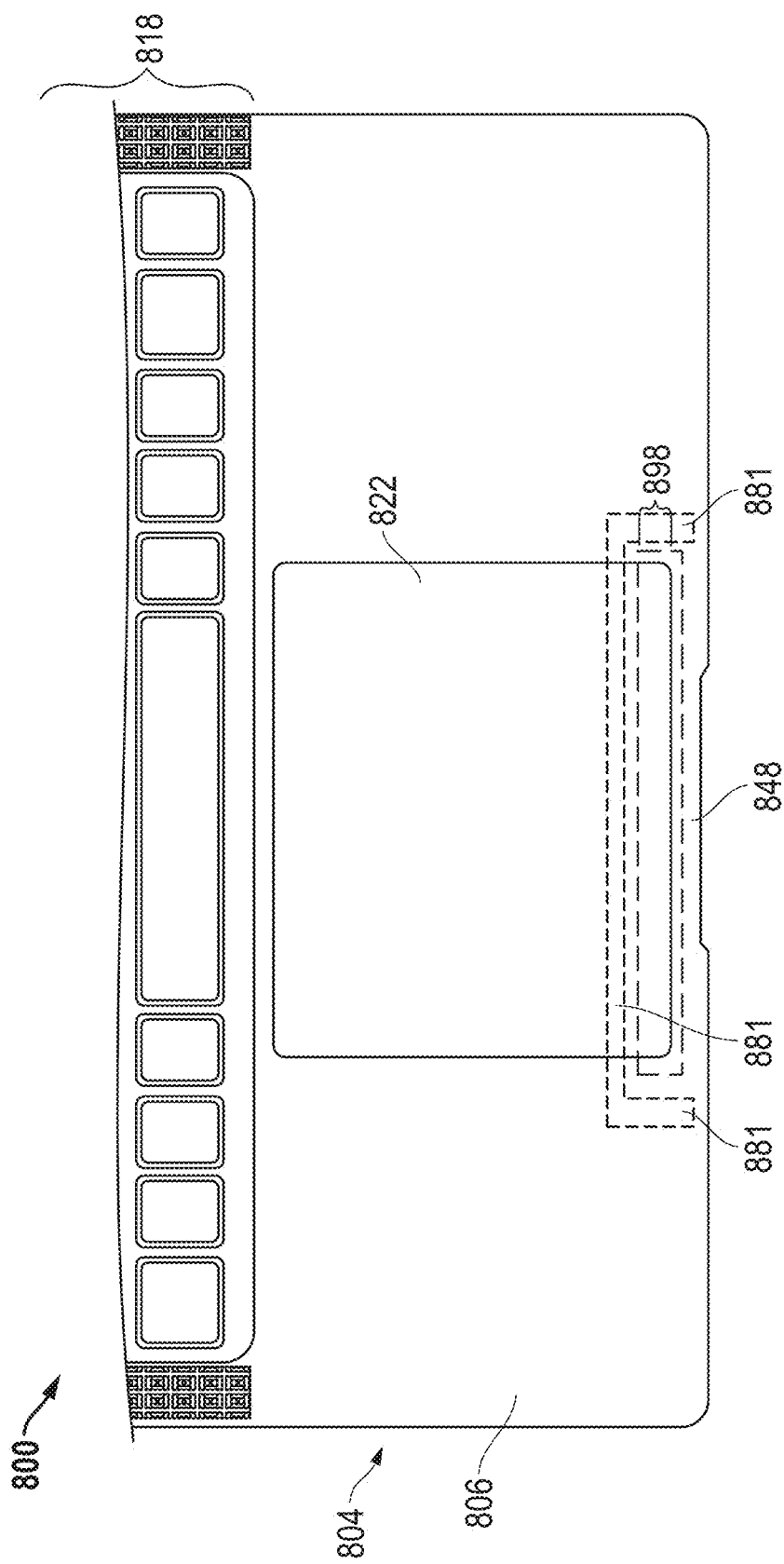
FIG. 8 is a graphic diagram of a top view of a base chassis of an information handling system according to another embodiment of the present disclosure.

FIG. 8 is a graphic diagram of a top view of a base chassis 804 of an information handling system 800 according to another embodiment of the present disclosure. FIG. 8 shows a c-cover 806 used as a cover to house the components of the information handling system 800 the touchpad 822, a keyboard 818, a processor, a memory storage device, a PMU, a battery, and the like. In an embodiment, the c-cover 806 is made of a metal such as an aluminum alloy.

As described herein, the touchpad 822 may be formed over the or a portion of the antenna location 848, shown in dashed lines in FIG. 8. As seen in FIG. 8, the touchpad 822 overlaps the antenna location 848 by an overlapping distance 898. This overlapping distance may determine the height of the latticed window formed into the layers (e.g., the metallic layers) of the touchpad 822. Again, this latticed window may allow the RF signals emitted by the antenna location 848 and those RF signals received at the antenna location 848 from an access point or base station to be sent by and received at the antenna location 848. This latticed window may also include the metallic layers that each include conductors, or a grounding layer used to detect a change in a proportional capacitance at any location over the surface of the touchpad 822 for accepting touchpad inputs as well.

At or around the antenna location 848, a proximity sensor location 881 indicates a proximate sensor that (shown with additional dashed lines) may be added within the base chassis 804 in order to detect human presence. As described herein, the proximity sensor location 880 may be one of a plurality of proximity sensors associated with a plurality of antennas location 848 and antenna systems. Each of these proximity sensors may detect the presence of a human and, accordingly, the detected presence of a human may be used to reduce the power supplied to any one of these antenna locations 848. As described herein, the touchpad 822 may also be repurposed into a proximity sensor by operatively coupling the ISH (not shown) to the metallic layers within the touchpad 822 when orientation sensors (e.g., sensors associated with the integrated sensor hub) detect that the information handling system 800 is in a tablet configuration. As described herein, the conversion of the information handling system 800 into the tablet configuration may cause the sensing capabilities of other proximity sensors such as those shown at location 881 within the base chassis 804 (or any other chassis) of the information handling system 800 to not perform as well or otherwise be inhibited from detecting human presence. Because the touchpad 822 is no longer used as in input device due to its relative location to the video/graphic display device of the display chassis in tablet configuration, the metallic layers of the touchpad 822 may be operatively coupled to the ISH as an additional proximity sensor or the main proximity sensor used to detect the presence of a human being. Switching or repurposing the touchpad 822 from being an input device to a proximity sensor location 880 may include, among other processes, uncoupling the touchpad 822 from a processing device executing a touchpad driver (e.g., with an embedded controller) and be instead coupling it to a P-sensor IC. The opposite process may also be conducted when the sensors have detected that the information handling system 800 has been taken out of the tablet configuration.

Figure 9:
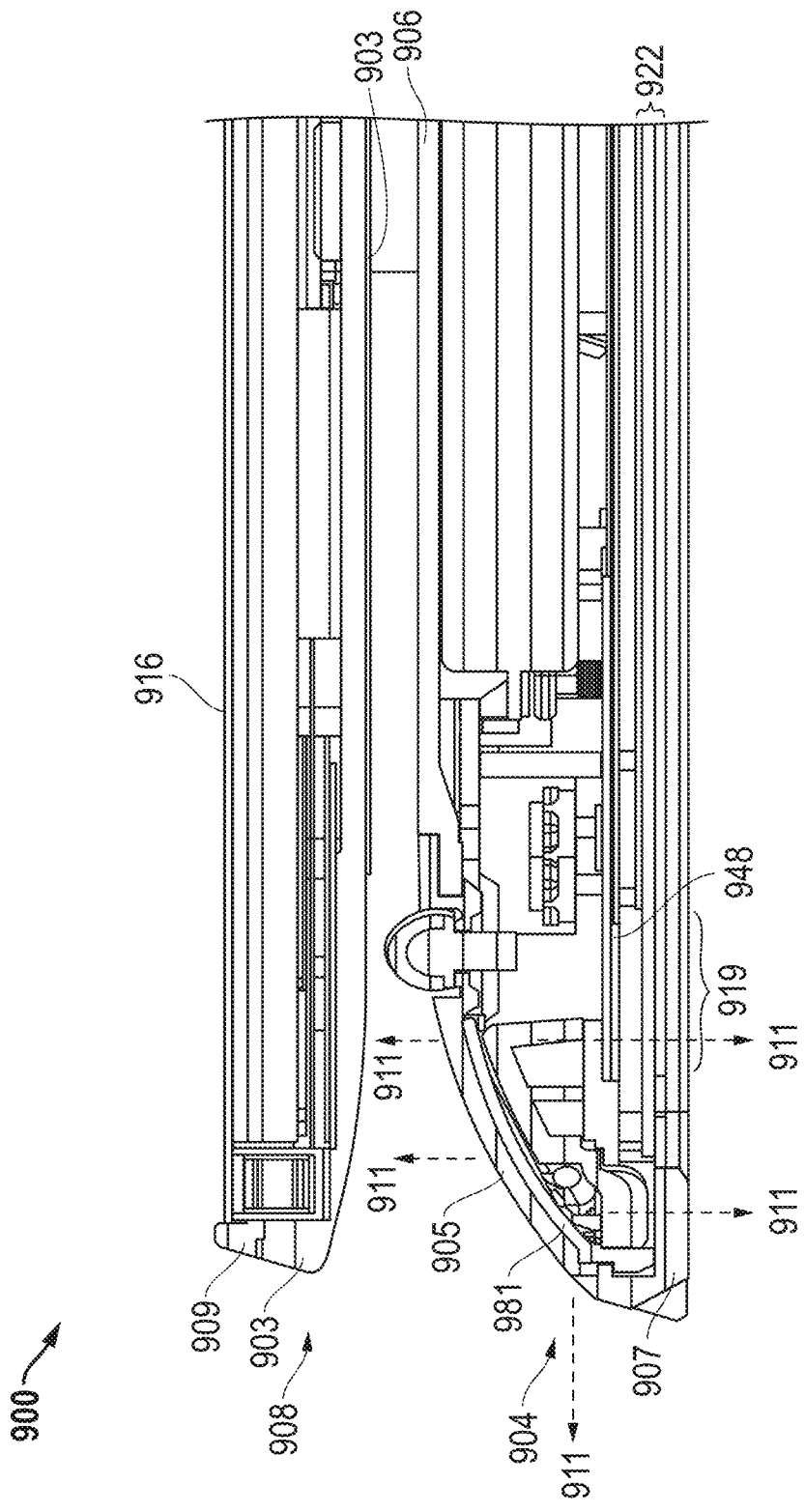
FIG. 9 is a graphic diagram of a side, cross-section view of a base chassis and display chassis of an information handling system in a tablet configuration according to another embodiment of the present disclosure.

FIG. 9 is a graphic diagram of a side, cross-section view of a base chassis 904 and display chassis 908 of an information handling system 900 in a tablet configuration according to another embodiment of the present disclosure. FIG. 9 shows the side, cutout view of the base chassis 904 that includes only a view of a partial length of the base chassis 904. Similarly, FIG. 9 shows a side, cutout view of the display chassis 908 that includes only a view of a partial length of that display chassis 908. It is appreciated, however, that the base chassis 904 and display chassis 908 may be operatively coupled to each other via a hinge (not shown) at those ends of the base chassis 904 and display chassis 908 not shown. This forms a 360-degree information handling system 900 that allows a d-cover 906 of the base chassis 904 to face an a-cover 903 of the display chassis 908 when the information handling system 900 is placed in the tablet configuration as shown in FIG. 9.

As described herein, the display chassis 908 includes a video/graphics display device 916 that is placed on a side of the display chassis 908 that is opposite the a-cover 903. In an embodiment, the display chassis 908 may further include a bezel 909 that surrounds the video/graphics display device 916 in order to secure the video/graphics display device 916 to the display chassis 908. In an embodiment, the a-cover 903 of the display chassis 908 may be made of a metal in order to increase the aesthetic appeal of the information handling system 900 and increase the durability of the display chassis 908. The metal construction of the a-cover 903 and the display chassis 908 may inhibit, however, the effectiveness of the proximity sensor 981 placed in the base chassis 904 by limiting the distance and direction that the proximity sensor 981 present in the base chassis 904 can detect human presence. FIG. 9 shows potential directional arrows 911 where the proximity sensor 981 may detect human proximity and layer or portions of the a-cover 903, d-cover 906, or the c-cover 907 that may block sensing human proximity in these directions. However, despite a plastic portion 905 of the d-cover 906 allowing some proximity sensing and RF transception in a side direction from the base chassis 904, other directions are either inhibited by the metallic a-cover 903, d-cover 906, or c-cover 907 when in this tablet configuration. In some embodiments, a transception window of a touchpad 922 in the c-cover 907 may allow RF signal transception through the c-cover 907, however proximity sensing is diminished at the proximity sensor 981 due to the distance to the c-cover 907.

The base chassis 904, in an embodiment, may comprise a metal c-cover 907 and used, along with a d-cover 906 to house various components of the information handling system 900 such as the touchpad 922, an antenna 948, a proximity sensor 981, a processor, a battery, a PMU, any cooling system, and the like. In an embodiment, portions of the d-cover 906 may include a plastic window d-cover 905 that allows the proximity sensor 981 to detect human proximity to the information handling system 900 when the information handling system 900 is in a clamshell configuration or, to a lesser effectiveness, when the information handling system 900 is in the tablet configuration as shown in FIG. 9. In an embodiment, the d-cover 906 may also include an RF transparent window d-cover section 905 that allows for the antenna 948 to transceive therethrough as well. Remaining portions of the d-cover 906 may be made of a metal similar to the a-cover 903.

Without needing to add additional proximity sensors to the c-cover 907 and as described in embodiments herein, the touchpad 922 of the information handling system 900 may be repurposed into a proximity sensor when, as shown in FIG. 9, the information handling system 900 has been placed into a tablet configuration. By repurposing the touchpad 922 to operate as a proximity sensor, the proximity of a user relative to an antenna 948 may be determined in order to reduce power to the antenna 948 and, thereby, reduce the SAR to the user. This increases the safety of the user during operation of the information handling system 900 while still prioritizing for the highest data throughput to a network using the wireless radios and antennas 948 in the information handling system 900 when no proximity is sensed.

During operation, a platform control hub within the information handling system 900 may receive data from a number of orientation or other sensors that help to determine when the information handling system 900 is placed in the tablet configuration. These sensors may be operated using an ISH similar to that described in embodiments herein. In an example embodiment, the ISH may include a temperature sensor, a pressure sensor, a Hall effect sensor, a magnetic sensor, a magnetometer, an accelerometer, a hinge sensor, a light sensor (e.g., ultraviolet light sensor, IR light sensor, ambient light sensor, color sensor), a gyroscopic sensor, a camera, and a proximity sensor, among others. Each of these sensors may provide data to an ISH indicative of the configuration of the display chassis 908 relative to the base chassis 904 (e.g., clamshell configuration or tablet configuration) which provides that data to a platform control hub.

When the PCH has received input from these sensors indicating that the information handling system 900 is in a clamshell configuration, the PCH may provide this data to an embedded controller. The embedded controller may then direct a P-sensor IC to detect the presence of a user or other human body part near the antenna 948 using one or more proximity sensors 981 that is relatively close to the antenna 948 such as mounted near the portion of the d-cover 906. The proximity sensor 981 shown in FIG. 9 may be placed at or near the antenna 948 so that the human presence can be detected at the antenna 948. When the P-sensor IC detects the presence of a human, the embedded controller may access a power table (also called a look-up table) in order to determine if and to what degree to reduce power to the antenna 948 as described herein.

When the PCH has received input from these sensors indicating that the information handling system 900 is in a tablet configuration as shown in FIG. 9, the platform control hub may send a signal to the embedded controller indicative of this tablet configuration. In an embodiment, the embedded controller may be a processing device used to control the repurposing of the touchpad 822. In an embodiment, because the embedded controller may operate above the execution of the OS, the embedded controller may act regardless of the software or other hardware being executed at any given time on the information handling system 900. Thus, an embedded controller or an MCU may have control over the processes associated with the touchpad 922 in various embodiments. In an embodiment, the embedded controller may direct the platform control hub to send the signals indicating the information handling system is in a tablet configuration directly to a MCU so that the MCU can direct a P-sensor IC to be operatively coupled to the touchpad 922 in order to repurpose the metallic layers of the touchpad 922 as a proximity sensor. It is appreciated that the embedded controller, platform control hub, and MCU may communicate with each other and the P-sensor IC via any serial communication bus such as an inter-integrated circuit (I²C). For example, this I²C communication may be used when the MCU, the embedded controller, and platform control are on the same PCB or distinct PCBs.

During operation and as the embedded controller, MCU, or other controller has received the signal from the PCH that the information handling system 900 is in a tablet configuration (e.g., signals from the sensors associated with the ISH), the embedded controller, MCU, or other controller switches the touchpad 922 off from being operatively coupled to the processor for receiving touchpad inputs. According to one or more embodiments herein, the embedded controller, MCU, or other controller may operatively couple the metallic layers of the touchpad 922 to the ISH for use as a proximity sensor via a proximity sensor line. This proximity sensor line may, when the information handling system 900 is in any configuration other than a tablet configuration (e.g., a clamshell configuration), be operatively coupled to the antenna 948 of the wireless radio or one or more dedicated proximity sensors (not shown) in order to detect the presence of a user and operation of the antennas 948. The embedded controller, MCU, or other controller may either continue to use the antenna 948 or other proximity sensor 981 even when the information handling system 900 is in a tablet configuration in some embodiments. When in the tablet configuration, however, the platform control hub may, via a I²C serial communication I²C line, direct the embedded controller, MCU, or other controller to uncouple the touchpad 922 from a processing device executing a touchpad driver such as the CPU and be, instead, coupled to the P-sensor IC for use as an additional proximity sessor or the only proximity sensor being operated. This may be done by operatively coupling the metallic layers of the touchpad 922 to the P-sensor IC so that the changes in capacitance around the surface of the touchpad 922 may be detected by the P-sensor IC. The uncoupling of the touchpad 922 from the processor such as the CPU executing the touchpad driver may be controlled by the embedded controller, MCU, or other controller in various embodiments.

As the P-sensor IC is operatively coupled to the metallic layers of the touchpad 922, the P-sensor IC may provide human proximity detection signals, based on capacitance changes at the touchpad 922, to the embedded controller. The touchpad 922 described herein may include a plurality of additional layers besides the plurality of metallic layers. These other layers may include insulation layers, protective layers, and glass layers among others. The embedded controller, when these human proximity signals are received, addresses a power table at the BIOS of the information handling system 900 in order to determine if and to what extent power to the antenna 948 should be reduced in order to protect the user from physical harm from the EM radiation emitted from the antenna 948 and conform to industry SAR standards. This power table (also referred to herein as a look-up table) may include data describing which the amount of power to reduce at any antenna 948, if any, as well as whether to reduce that power based on the RF emitted by those antennas 948. As described herein, the power table may be used to cross-reference the type of antenna 948 being used, the RF emitted by the antenna 948, and what distance from the antenna 948 the human proximity is detected. Each of these factors along with others may be addressed at the look-up table by the embedded controller in order to determine if and to what extent the power is to be reduced at the antennas 948. This process may continue with the P-sensor IC detecting whether the touchpad 922, repurposed as a proximity sensor, has detected human presence or not and addressing the power provided to the antenna 948. It is appreciated that when human proximity is not detected, the power provided to the antenna 948 to transceive data is not reduced so that an optimal data throughput may be realized. In a specific embodiment, an ACPI may be implemented to assist the embedded controller to perform this power management as it relates to the amount of power provided to the antenna 948.

Figure 10:
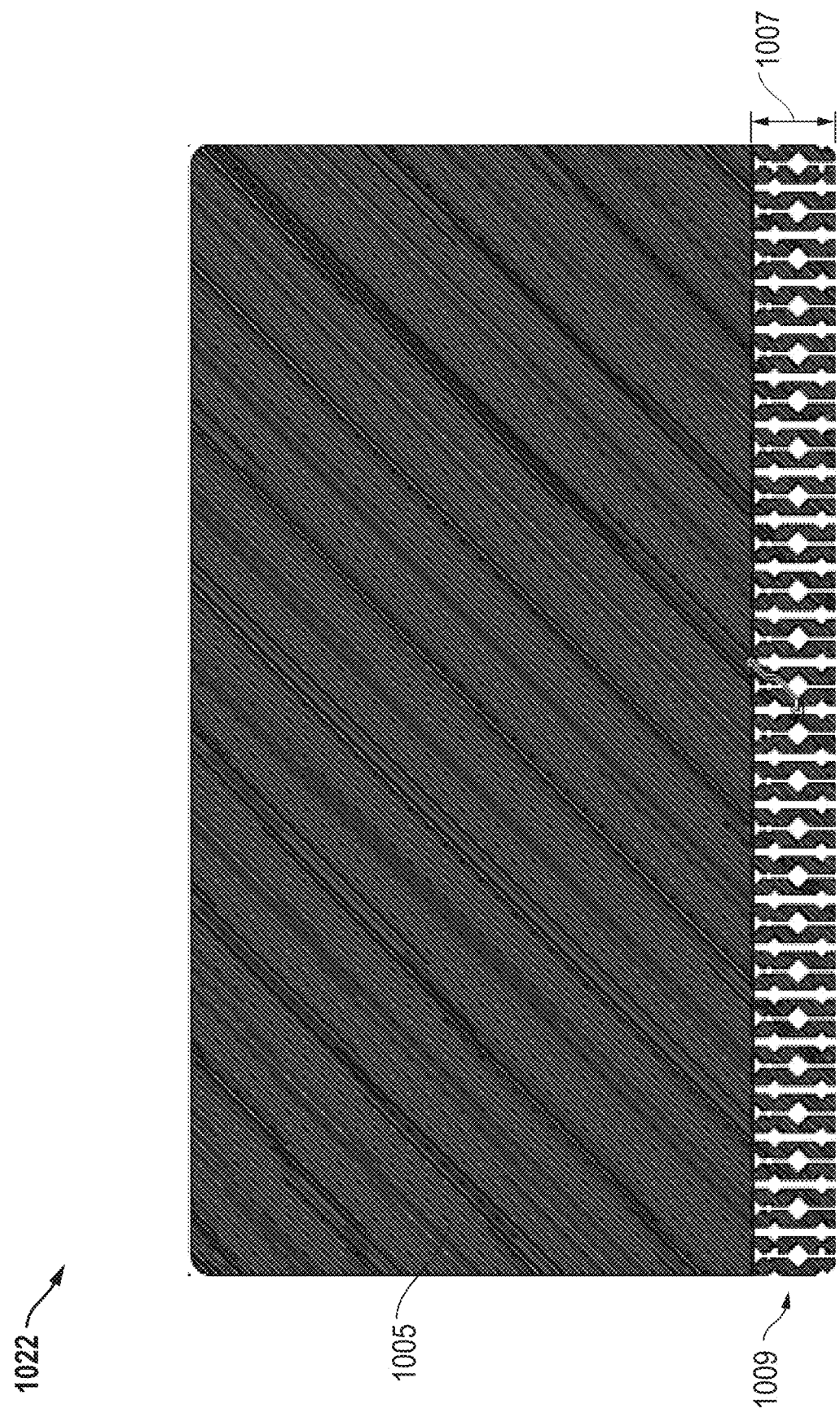
FIG. 10 is a graphic diagram of a top view of a metallic layer of a touchpad of an information handling system according to an embodiment of the present specification.
Figure 11:
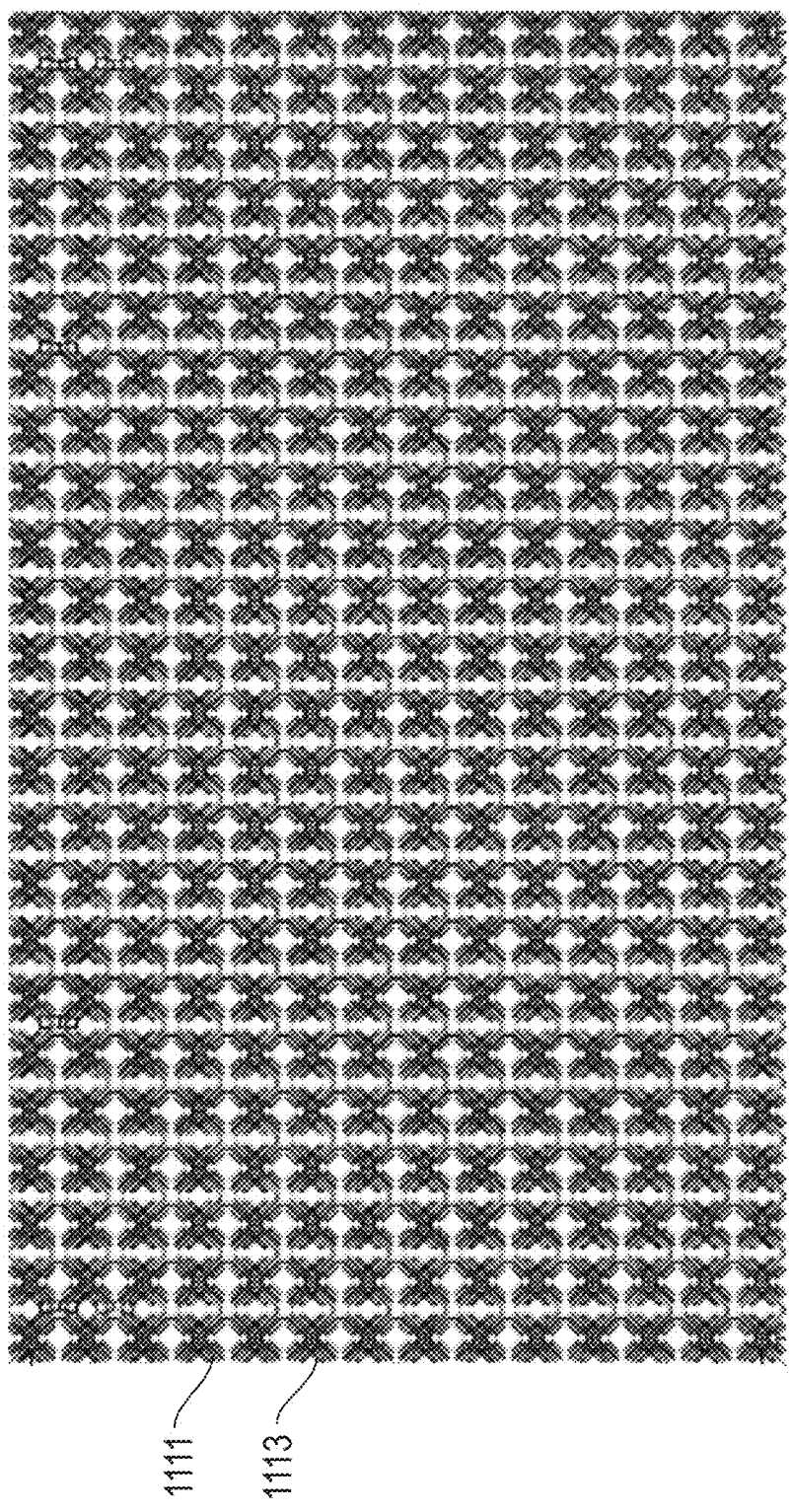
FIG. 11 is a graphic diagram of a top view of a plurality of layers of conductors of a touchpad of an information handling system according to an embodiment of the present specification.

FIG. 10 is a graphic diagram of a top view of a metallic layer 1005 of a touchpad 1022 of an information handling system according to an embodiment of the present specification. As described herein, this metallic layer 1005 may be a ground layer and one of many layers that form the touchpad 1022. In an embodiment, this metallic layer 1005 may be one of many metallic layers 1005 each of which include a series of conductors formed thereon. For example, the metallic layer 1005 have conductors that are arranged in an array of parallel lines as shown in FIG. 11 below. These layers may be separated by an insulation layer with the parallel lines of the conductors on each layer at right angles to each other to form a grid. An electrical signal may be applied to the array of conductors and the current between the nodes creates a proportional capacitance. As the user touches the surface of the touchpad 1022, a change in capacitance at the location along the surface of the touchpad 1022 is used to indicate a touch and its relative location. This change in capacitance is detected and used as input as described herein. This detection of touch from a user may be conducted by an embedded controller, a microcontroller, or the like executing a touchpad driver and provided to interface with application software executing on a processor such as a CPU. As described in some embodiments herein, however, the detection of the change in capacitance is detected when the information handling system is in any configuration except for a tablet configuration. When the information handling system is in a tablet configuration, this metallic layer 1005 or other layers are repurposed, according to the embodiments herein, as a proximity sensor using the metallic layer 1005 and other layers as a capacitive body that emits an EM field to detect human presence with any change in capacitance.

As described herein, an antenna may be placed behind the touchpad and allowed to transmit through a portion of the touchpad via, for example, a latticed window 1009 formed in the ground layer 1005 of the touchpad 1022. This latticed window 1009 may allow the RF signals emitted by the antenna and those RF signals received at the antenna from an access point or base station to be sent by and received at the antenna under the metallic ground layer window 1009 of the touchpad 1022. This latticed window 1009 may also include the metallic layers that include conductors used to detect a change in a proportional capacitance at any location over the surface of the touchpad 1022 for touchpad 1022 input detection. In an embodiment, the area 1007 of the latticed window 1009 may be about 9.48 mm and may correspond to the location of the antenna underneath the touchpad 1022. In an embodiment, the height 1007 of the latticed window 1009 may be between 4 mm and 10 mm to permit a sufficient aperture for RF transmission and reception form the antenna underneath but any dimension or shape of window is contemplated in the embodiments herein.

FIG. 11 is a graphic diagram of a top view of a plurality of layers of conductors 1111, 1113 of a touchpad 1122 of an information handling system according to an embodiment of the present specification. As described herein, the layers of conductors 1111, 1113 may each include conductors that are arranged in an array of parallel lines. From one layer of conductors 1111, 1113 to another layer of conductors 1111, 1113, the parallel arrangement of these conductors 1111, 1113 may be such that the parallel arrangement of the conductors 1111 of a first layer run perpendicular to the parallel arrangement of the conductors 1113 of a second layer. As described in connection with FIG. 10, the layers of conductors 1111, 1113 may be placed on the latticed window (e.g., FIG. 10, 1009) such that the RF signals to and from the antenna may be transceived therethrough but still operate to detect touch inputs to the touchpad 1122.

Figure 12:
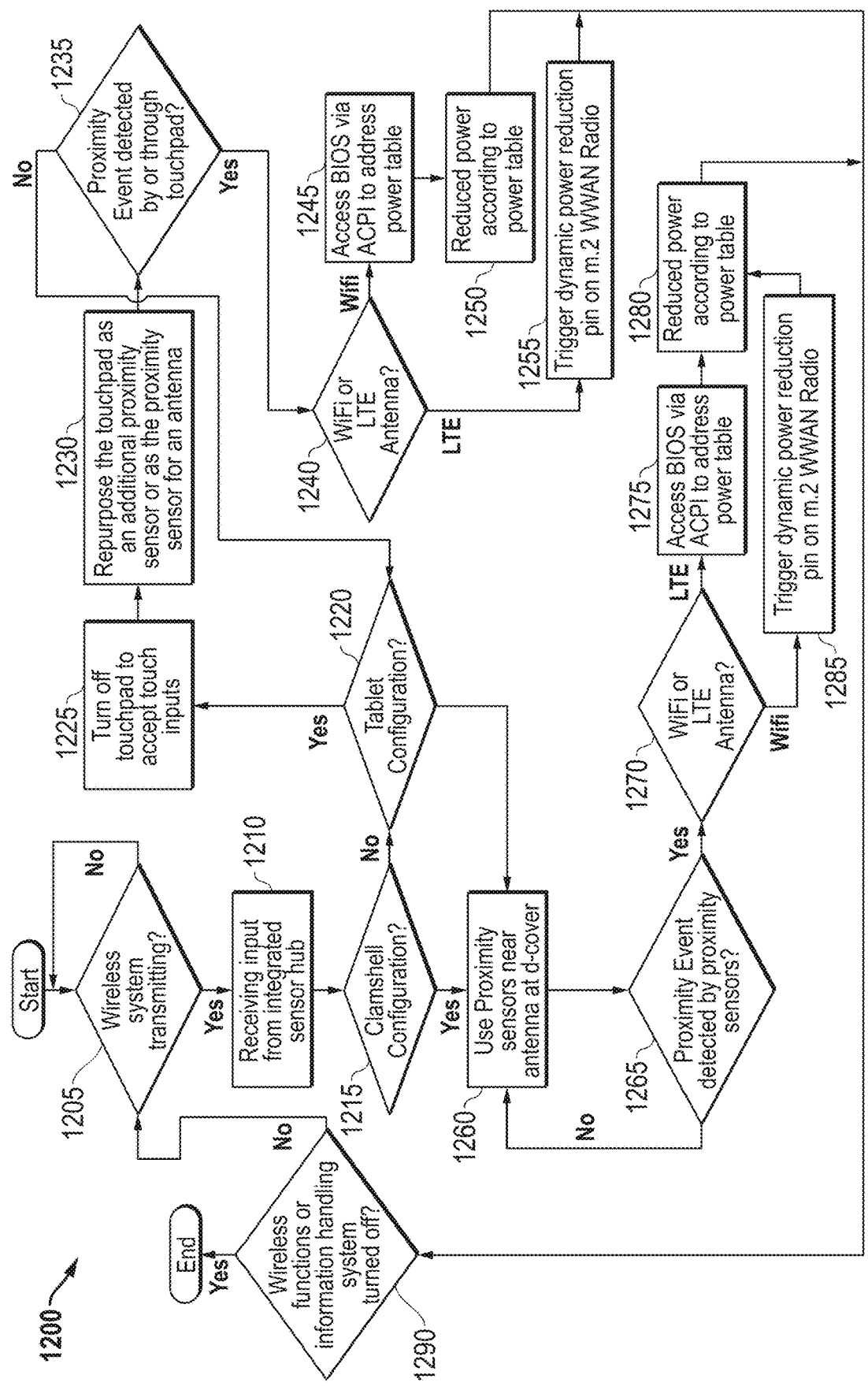
FIG. 12 is a flow diagram illustrating a method of operating a human proximity sensing system of an information handling system according to an embodiment of the present disclosure.

FIG. 12 is a flow diagram illustrating a method 1200 of operating a human proximity sensing system of an information handling system according to an embodiment of the present disclosure. In an embodiment, the proximity sensing system of the information handling system includes any number of proximity sensors including a touchpad that may be used as a proximity sensor associated with any number of antennas. These proximity sensors are used to detect the presence of humans near the antennas in order to determine whether and to what extent power to the antennas are to be reduced. According to the embodiments of the present specification, the information handling system includes dedicated proximity sensors (e.g., proximity sensor location 981, FIG. 9) used to detect human presence near an antenna when the information handling system is in a configuration other than a tablet configuration. As described herein, the information handling system includes a touchpad that may be repurposed as the proximity sensor or an additional proximity sensor when the information handling system is in a tablet configuration.

The method 1200 may include, at block 1205, with determining whether the wireless system within the information handling system is transmitting. As described herein, the SAR of the EM radiation from the antennas may exceed, at times during operation, limits set by certain regulations imposed or within an industry. The SAR rate may be measured and kept at or below a threshold level so as to protect the user's body from potential adverse effects of the exposure to this EM radiation. Where the wireless systems are not transmitting, however, the SAR levels are not a concern and the method 1200 may end at this time. The information handling system may include a CPU executing an operating system or a wireless adapter to determine at block 1205 whether the wireless system is transmitting.

Where the wireless systems are transmitting at block 1205, the method 1200 may continue with receiving input from any number of sensors associated with the integrated sensor hub at block 1210. The ISH may be operatively coupled to a processing device such as a processor, an embedded controller, or a microcontroller as well as a platform control hub so that data gathered by the sensors associated with the ISH may be processed by these devices. In an embodiment, the ISH may orientation or state sensors include a temperature sensor, a pressure sensor, a Hall effect sensor, a magnetic sensor, a magnetometer, an accelerometer, a hinge sensor, a light sensor (e.g., ultraviolet light sensor, infrared (IR) light sensor, ambient light sensor, color sensor), a gyroscopic sensor, a camera, and a proximity sensor, among others. Any of these sensors may provide data to an ISH which provides that data to the PCH. The processors described herein may be augmented by this platform control hub in an embodiment. Each of these sensors may provide data to the ISH in order to determine if and when the information handling system is in a specific configuration such as the tablet configuration or clamshell configuration as described herein. Where the wireless systems are not transmitting at block 1205, the method 1200 may return to block 1205 to continue to monitor whether the wireless system is transmitting via a wireless adapter.

In an embodiment, the method 1200 may include determining whether the information handling system is in a clamshell configuration at block 1215. As described herein, the orientation of a display chassis relative to a base chassis of the information handling system 100 may describe the configuration of the information handling system 100. Examples of how these sensors associated with the ISH can be used to determine the relative locations of the display chassis to the base chassis has been described herein and may include, in an example embodiment, the use of a hinge sensor, the use of a hall effect sensor and a corresponding magnet, the use of a light sensor or camera to detect light characteristics expected to be associated with individual configurations, as well as other orientation sensors (e.g., accelerometers, gyroscopic sensors, magnetometer, etc.).

A clamshell configuration may a similar to that configuration shown in FIG. 2A in an embodiment. Where the data from the sensors associated with the ISH indicate that the information handling system is not in a clamshell orientation at block 1215, the method 1200 may further include determining whether the information handling system is in a tablet configuration. A tablet configuration may be similar to that configuration shown in FIG. 2B in an embodiment. Here, the display chassis of the information handling system may be rotated completely away from the base chassis about a hinge and placed at an angle about 360 degrees from the base chassis. In this tablet configuration the orientation of the d-cover relative to the a-cover is such that the d-cover and a-cover are against each other such that a user may view the display within the b-cover but is limited in any interaction with the touchpad and/or keyboard within the c-cover. In this embodiment, the touchpad within the c-cover is inaccessible due to this orientation of the base chassis relative to the display chassis. Because the touchpad is now on an opposite side of the display device of the display chassis, the touchpad is near a surface or on a user's lap when the information handling system is in use.

Where the data from the sensors associated with the ISH indicates to the PCH that the information handling system is in a tablet configuration at block 1220, the method 1200 continues at block 1225 with turning off the touchpad to accept touch inputs to be sent via a touchpad driver for commands to an OS or application program such as for cursor control or other touchpad operations. In this embodiment, the touch signals at the touchpad will no longer be recorded and processed by the MCU controller, for example, for communication to the touchpad driver software of the operating system and by the CPU. This process may also include, at block 1230, with repurposing the touchpad as an additional proximity sensor or as the proximity sensor for an antenna. During operation, in an embodiment, and when the embedded controller, for example, has received the signal from the PCH that the information handling system is in a tablet configuration, the MCU directs the P-sensor IC to be operatively coupled to the touchpad or active via a proximity sensor line. When in the tablet configuration, the platform control hub may, via a I$^2$C serial communication I$^2$C line, direct the MCU controller or EC to uncouple the touchpad from a processing device executing a touchpad driver such as the CPU and be, instead, coupled to the P-sensor IC for use as an additional proximity sessor or the only proximity sensor. This may be done by operatively coupling the metallic layers of the touchpad to the P-sensor IC so that the changes in capacitance around the surface of the touchpad may be detected by the P-sensor IC. The uncoupling or turning off of the touchpad from the processor such as the CPU executing the touchpad driver from accepting or processing touch input commands (e.g., a finger touch or gesture) may be controlled by the embedded controller or MCU controller in various embodiments.

After the repurposing of the touchpad at block 1230 has been completed, the method 1200 may include, at block 1235, determining whether a proximity event has been detected through the now-repurposed touchpad. This proximity event is detected when a capacitance level has changed at the touchpad. In order to do this the touchpad includes a metallic layer that operates with two conductor layers each having an array of conductors arranged in parallel lines. These layers may be separated by an insulation layer with the parallel lines of the conductors on each layer at right angles (e.g., perpendicular) to each other to form a grid. Where a change in capacitance has been detected as a user's body part (e.g., a lap or a hand) is close to the touchpad (e.g., 20 mm or above), the proximity event is detected. Where no proximity event has been detected, the method 1200 may continue with again determining whether the information handling system is still in the tablet configuration at block 1220. In an embodiment, one or more proximity sensors separate from the touchpad are disposed at a different locations within the information handling system chassis, e.g., the bottom or side of the base chassis or d-cover than the touchpad. These other proximity sensors may be placed at or near one or more antennas in these different locations so that the human presence can be detected at the antennas in configurations other than a tablet configuration.

When a proximity event has been detected by the repurposed touchpad, a determination of a type of antenna transceiving may be determined at block 1240. In an embodiment, the information handling system may include both WiFi and LTE antenna systems among others. These different types of antenna systems may be addressed individually in different ways in the embodiments herein. For example, where the antenna system is a WiFi antenna system (e.g., WLAN antenna system) an embedded controller or other processing device may access a BIOS via an ACPI in order to address a power table (e.g., look-up table) at block 1245. The embedded controller addresses this power table at the BIOS in order to determine if and to what extent power to the antennas, such as the WiFi antenna in this embodiment, should be reduced in order to protect the user from physical harm from the EM radiation emitted from these antennas and conform to industry SAR standards. This power table (also referred to herein as a look-up table) may include data describing which the amount of power to reduce at any of the antennas, if any, as well as whether to reduce that power based on the RF emitted by those antennas at block 1250. As described herein, the power table may be used to cross-reference the type of antennas being used, the RF emitted by the antennas, and what distance from the antennas the human proximity is detected. Each of these factors along with others may be addressed at the look-up table by the embedded controller in order to determine if and to what extent the power is to be reduced at the antennas at block 1250. This process may continue with the P-sensor IC detecting whether the touchpad, repurposed as a proximity sensor, has detected human presence or not and addressing the power provided to the antennas. It is appreciated that when human proximity is not detected at block 1235, the power provided to the antennas such as this WiFi antenna to transceive data is not reduced so that an optimal data throughput may be realized. In a specific embodiment, an advanced configuration and power interface (ACPI) may be implemented to assist the embedded controller to perform this power management as it relates to the amount of power provided to the antennas at block 1250 for example.

Although a similar process may be followed where the antenna being used is an LTE antenna (e.g., WWAN antenna), specific circuitry associated with the WWAN radio may be used to reduce the power when a proximity event is detected at block 1255. In this embodiment, at block 1255, the embedded controller may trigger a dynamic power reduction (DPR) pin on a m.2 WWAN radio. This DPR pin may be built into the radio module associated with the WWAN radio module and may be accessed in order to reduce transmission power levels at the antenna based on the human proximity detected by the repurposed touchpad. In either example, the method 1200 may continue with the reduction of power until human proximity is no longer detected and power is increased at these antennas or the wireless functions or the information handling system is turned off at block 1275. Where the wireless functions or the information handling system is turned off at block 1275, the process may end. Where the wireless functions or the information handling system is not turned off at block 1275, the method 1200 may continue back at block 1205 with determining if there is a proximity event as described herein.

It should be noted that the method 1200 further includes processes where a clamshell configuration (or any other configuration) is detected at block 1215. Again, the configuration of the information handling system may be determined based on input from one or more sensors within the information handling system (e.g., those sensors associated with the ISH). Where a clamshell configuration (or any other configuration) is detected at block 1215, the method 1200 may continue with utilizing proximity sensors near an antenna within the d-cover of the information handling system. As described herein, the information handling system may include one or more dedicated proximity sensors associated or near one or more antennas. When the information handling system is in a clamshell configuration, these proximity sensors may be used to detect human proximity at the information handling system. In an embodiment, where the antenna is an antenna associated with or near the touchpad, the touchpad may also be used as both an input device as well as a proximity sensor as described herein. In this embodiment, the touchpad may be tuned to detect both near presence (e.g., up to about 6 cm away from the touchpad) and a touch input at the touchpad. For example, as the human presence is detected via detected changes in the capacitance in the metallic layers of the touchpad, the level of change in the capacitance may be different as a user's body part approaches the touchpad as compared to as when a user's body (e.g., a finger) contacts the surface of the touchpad. These different levels of change in capacitance may be threshold levels that when reached indicate human proximity (e.g., a first capacitive threshold) or human touch at the touchpad (e.g., a second capacitive threshold). As described herein, the look-up table may include data descriptive of the first capacitive threshold and the second capacitive threshold.

The method 1200 may include determining, at block 1265 whether human proximity (e.g., a proximity event) has been detected. Similar to above, the type of transceiving antenna being operated may also be determined at block 1265. As described in an embodiment herein, the information handling system may include dedicated proximity sensors that operate either when the information handling system is not in a tablet configuration or operate regardless of the configuration the information handling system is in. The power provided to the antennas of the information handling system may still be reduced based on detected human proximity by these proximity sensors and/or the touchpad as a tuned proximity sensor. In an embodiment, the information handling system may include both WiFi and LTE antenna systems among others. These different types of antenna systems may be addressed individually in different ways in the embodiments herein. To this end, the method 1200 includes, at block 1270, determining whether the antennas currently transmitting are a WiFi antenna or an LTE antenna. For example, where the antenna system is a WiFi antenna system (e.g., WLAN antenna system) an embedded controller or other processing device may access a BIOS via an ACPI in order to address a power table (e.g., look-up table) at block 1275. The embedded controller addresses this power table at the BIOS in order to determine if and to what extent power to the antennas, such as the WiFi antenna in this embodiment, should be reduced in order to protect the user from physical harm from the EM radiation emitted from these antennas and conform to industry SAR standards at block 1280. This power table (also referred to herein as a look-up table) may include data describing which the amount of power to reduce at any of the antennas, if any, as well as whether to reduce that power based on the RF emitted by those antennas. As described herein, the power table may be used to cross-reference the type of antennas being used, the RF emitted by the antennas, and what distance from the antennas the human proximity is detected. Each of these factors along with others may be addressed at the look-up table by the embedded controller in order to determine if and to what extent the power is to be reduced at the antennas. This process may continue with the P-sensor IC detecting whether the touchpad, repurposed as a proximity sensor, or other dedicated proximity sensors has detected human presence or not and addressing the power provided to the antennas. It is appreciated that when human proximity is not detected, the power provided to the antennas such as this WiFi antenna to transceive data is not reduced so that an optimal data throughput may be realized. In a specific embodiment, an advanced configuration and power interface (ACPI) may be implemented to assist the embedded controller to perform this power management as it relates to the amount of power provided to the antennas at block 1275.

Although a similar process may be followed where the antenna being used is an LTE antenna (e.g., WWAN antenna), specific circuitry associated with the WWAN radio may be used to reduce the power when a proximity event is detected at block 1285. In this embodiment, at block 1285, the embedded controller may trigger a dynamic power reduction (DPR) pin on a m.2 WWAN radio. This DPR pin may be built into the radio module associated with the WWAN radio module and may be accessed in order to reduce transmission power levels at the antenna based on the human proximity detected by the repurposed touchpad. In either example, the method 1200 may continue with the reduction of power until human proximity is no longer detected and power is increased at these antennas or the wireless functions or the information handling system is turned off at block 1290. Where the wireless functions or the information handling system is turned off at block 1290, the process may end. Where the wireless functions or the information handling system is not turned off at block 1290, the method 1200 may continue back at block 1205 with determining if the wireless system is transmitting as described herein.

The blocks of the flow diagrams of FIG. 12 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system, comprising:
   a processor;
   a memory;
   a power management unit (PMU);
   a radio of a wireless interface device to transceive wirelessly via an antenna with a wireless network, where the antenna is located along a touchpad to transmit through a portion of a touchpad via in a base chassis of the information handling system;
   the touchpad to receive touch input via a surface of the touchpad in the touchpad via when the information handling system is detected in a clamshell configuration with a video/graphics display device of a display chassis of the information handling system upright relative to a base chassis of the information handling system, where the touch input is received by a touchpad driver and processed to a corresponding touch input command;
   an orientation sensor to detect when the information handling system is changed to a tablet configuration with a back side of the display chassis of the information handling system facing a bottom side of the base chassis of the information handling system; and
   a controller to:
   deactivate the touchpad from receiving the touch input for processing to a corresponding touch input command when the sensor detects the information handling system is in a tablet configuration;

to activate and operatively couple a metallic layer of the touchpad to a proximity sensor integrated circuit when the sensor detects the information handling system is in the tablet configuration to detect when a user's body is close to the antenna; and to reduce power for transmission via the antenna to reduce a specific absorption rate (SAR) level when the touchpad and proximity sensor integrated circuit detects, via the metallic layer, a proximity event when the user's body is proximate to the antenna.

2. The information handling system of claim 1 further comprising:

a plastic window formed on the bottom side of the base chassis as a transmission window for the antenna and proximity sensors disposed near the antenna at the bottom side of the base chassis for detection of proximity of a user's body when the information handling system is detected in the clamshell configuration.

3. The information handling system of claim 1 further comprising:

the metallic layer of the touchpad is made of copper and includes a latticed antenna window in a ground layer of the touchpad to allow transmission from the antenna through openings in the antenna window of the ground layer.

4. The information handling system of claim 1 further comprising:

the controller to activate an operatively coupled metallic layer of the touchpad to the proximity sensor integrated circuit to detect the proximity event when the user's body is close to the antenna during a clamshell configuration; and the controller tuned to determine a proximity to detect via the touchpad when the user's body is close to the antenna at a first threshold level of capacitance change and to determine a touch input received at the touchpad at a second threshold level of capacitance.

5. The information handling system of claim 1, wherein the base chassis of the information handling system is made of metal.

6. The information handling system of claim 1 wherein the controller accesses a power look-up table to determine how to reduce the power for transmission via the antenna to reduce the SAR level.

7. The information handling system of claim 1 further comprising:

an integrated sensor hub to receive data from a plurality of orientation sensors used to detect when the information handling system is in the tablet configuration or the clamshell configuration.

8. The information handling system of claim 1 further comprising:

the controller to turn off receiving touch input from a plurality of copper layers that each include an array of conductors arranged in parallel for detecting the touch input to the touchpad driver when the orientation sensor detects the information handling system is in a tablet configuration.

9. A human proximity sensing system of an information handling system, comprising:

an orientation sensor to detect when the information handling system is in a tablet configuration, the tablet configuration being a configuration when a back side of a display chassis of the information handling system is facing a bottom side of a base chassis of the information handling system; and a touchpad operatively coupled to a proximity sensor integrated circuit to be tuned to detect human proximity when the information handling system is in a tablet configuration, where an antenna of the information handling system is located proximate to the touchpad in the base chassis of the information handling system;

a controller to:

deactivate the touchpad to receive touch input for processing as corresponding touch commands when the orientation sensor detects the information handling system is the tablet configuration;

to activate an operatively coupled metallic layer of the touchpad to the proximity sensor integrated circuit to detect human proximity at the touchpad when the orientation sensor detects the information handling system is in the tablet configuration; and reduce power consumption at an antenna to reduce a specific absorption rate (SAR) level when the touchpad detects, via the metallic layer, a proximity event that a user's body is close to the touchpad and the antenna located proximate to the touchpad.

10. The human proximity sensing system of claim 9 further comprising:

the controller to activate the touchpad and tuned to receive touch input for processing as corresponding touch commands and to detect the proximity event of a presence of the user's body via the touchpad when the orientation sensor detects the information handling system is in a clamshell configuration.

11. The human proximity sensing system of claim 9 wherein the metallic layer of the touchpad includes a latticed window behind which the antenna is placed to allow radio frequency signals to pass through the latticed window and through the touchpad.

12. The human proximity sensing system of claim 9 further comprising a power look-up table accessed by a basic input/output system (BIOS) to determine how to reduce the power consumption at the antenna.

13. The human proximity sensing system of claim 9 further comprising:

an integrated sensor hub to receive data from a plurality of sensors used to detect when the information handling system is in the tablet configuration or clamshell configuration.

14. The human proximity sensing system of claim 9 further comprising:

the controller to activate the touchpad to receive touch input for processing as corresponding touch commands and detect the proximity event of a presence of the user's body via a dedicated proximity sensor placed near the antenna on the base chassis when the orientation sensor detects the information handling system is in a clamshell configuration.

15. A method of operating a human proximity sensing system of an information handling system, comprising:

with a processor, receiving touch input from a touchpad to be processed as corresponding touch commands via a surface of the touchpad when the information handling system is in a clamshell configuration with a video/graphics display device of a display chassis of the information handling system upright relative to a base chassis of information handling system;

with an orientation sensor, detecting when the information handling system is changed to a tablet configuration with a back side of the display chassis of the information handling system facing a bottom side of the base chassis of the information handling system;

with a controller, receiving a signal that the orientation sensor has detected that the information handling system is in a tablet configuration and deactivating the touchpad from receiving touch input to be processed as corresponding touch commands and activating and operatively coupling a metallic layer of the touchpad to a proximity sensor integrated circuit to detect human proximity at the touchpad and an antenna disposed along the touchpad; and reducing power for transmission at the antenna disposed along the touchpad to reduce a specific absorption rate (SAR) level when the proximity sensor integrated circuit detects, via the metallic layer of the touchpad, a proximity event when a user's body is close to the antenna.

16. The method of claim 15 further comprising:

detecting the information handling system is in the clamshell configuration;

activating the touchpad to receive touch input; and tuning the touchpad to detect the proximity event of a presence of the user's body being close to the antenna.

17. The method of claim 15 further comprising:

detecting the information handling system is in the clamshell configuration;

activating the touchpad to receive touch input; and utilizing proximity sensors on the base chassis to detect the proximity event of a presence of the user's body being close to the antenna.

18. The method of claim 15 further comprising:

increasing the power to the antenna when no proximity event is detected at the touchpad with the proximity sensor integrated circuit when the information handling system is in the tablet configuration.

19. The method of claim 15 wherein the metallic layer includes a latticed window behind which the antenna is placed to allow radio frequency signals to pass through the latticed window and through the touchpad.

20. The method of claim 15 wherein reducing the power to the antenna includes accessing a power look-up table with a basic input/output system (BIOS) operatively coupled to the controller to determine how to reduce the power at the antenna.

* * * * *